US012695440B2

(12) United States Patent (10) Patent No.: US 12,695,440 B2

Nagatomo (45) Date of Patent: Jul. 28, 2026

(54) ACOUSTIC WAVE DEVICE

(71) Applicant: Murata Manufacturing Co., Ltd., Nagaokakyo (JP)

(72) Inventor: Sho Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 122 days.

(21) Appl. No.: 18/894,286

(22) Filed: Sep. 24, 2024

(65) Prior Publication Data

US 2025/0015784 A1 Jan. 9, 2025

Related U.S. Application Data

(63) Continuation of application No. PCT/JP2023/012753, filed on Mar. 29, 2023.

(Continued)

(51) Int. Cl.
*H03H 9/58* (2006.01)
*H03H 9/02* (2006.01)
*H03H 9/17* (2006.01)

(52) U.S. Cl.
CPC ........ *H03H 9/584* (2013.01); *H03H 9/02031* (2013.01); *H03H 9/02157* (2013.01);
(Continued)

(58) Field of Classification Search
CPC .............. H03H 9/584; H03H 9/02031; H03H 9/02157; H03H 9/02228; H03H 9/173;
(Continued)

(56) References Cited

U.S. PATENT DOCUMENTS 10,491,192 B1 11/2019 Plesski et al.
2008/0106354 A1 5/2008 Kando
(Continued)

FOREIGN PATENT DOCUMENTS

JP 2011142613 A 7/2011
WO 2007007462 A1 1/2007
(Continued)

OTHER PUBLICATIONS

International Search Report in PCT/JP2023/012753, mailed Jun. 6, 2023, 2 pages.

(Continued)

*Primary Examiner* — Jorge L Salazar, Jr.
(74) *Attorney, Agent, or Firm* — Keating & Bennett, LLP

(57) ABSTRACT

An acoustic wave device includes first and second acoustic wave resonators, each including a piezoelectric layer and a functional electrode, and an acoustic coupling layer laminated between the piezoelectric layer of each of the first and second acoustic wave resonators. Each of the functional electrodes of the first and second acoustic wave resonators includes at least one pair of electrode fingers. In each of the first and second acoustic wave resonators, when a thickness of the piezoelectric layer is defined as d and a center-to-center distance of the electrode fingers adjacent to each other is defined as p, d/p is about 0.5 or smaller. The first and second acoustic wave resonators face each other across the acoustic coupling layer.

20 Claims, 14 Drawing Sheets

Related U.S. Application Data

(60) Provisional application No. 63/324,845, filed on Mar. 29, 2022.

(52) U.S. Cl.
CPC ........ *H03H 9/02228* (2013.01); *H03H 9/173* (2013.01); *H03H 9/176* (2013.01); *H03H 9/581* (2013.01)

(58) Field of Classification Search
CPC .... H03H 9/176; H03H 9/581; H03H 9/02559; H03H 9/02574; H03H 9/25; H03H 9/145
USPC .................................. 333/186, 188, 193–196
See application file for complete search history.

(56) References Cited

U.S. PATENT DOCUMENTS

| | | | |
|---|---|---|---|
| 2011/0131774 A1 | 6/2011 | Miyake | |
| 2016/0087186 A1* | 3/2016 | Burak | H03H 9/02228 |
| | | | 310/366 |
| 2016/0182007 A1* | 6/2016 | Bhattacharjee | H03H 3/02 |
| | | | 29/25.35 |
| 2019/0222197 A1* | 7/2019 | Khlat | H03H 9/589 |
| 2022/0216842 A1 | 7/2022 | Nagatomo et al. | |
| 2023/0127479 A1 | 4/2023 | Nagatomo | |
| 2024/0007081 A1 | 1/2024 | Iwamoto et al. | |

FOREIGN PATENT DOCUMENTS

| | | |
|---|---|---|
| WO | 2021060523 A1 | 4/2021 |
| WO | 2022014493 A1 | 1/2022 |
| WO | 2022202917 A1 | 9/2022 |

OTHER PUBLICATIONS

Written Opinion in PCT/JP2023/012753, mailed Jun. 6, 2023, 4 pages.

* cited by examiner

ACOUSTIC WAVE DEVICE

CROSS REFERENCE TO RELATED APPLICATIONS

This application claims the benefit of priority to Provisional Application No. 63/324,845 filed on Mar. 29, 2022 and is a Continuation Application of PCT Application No. PCT/JP2023/012753 filed on Mar. 29, 2023. The entire contents of each application are hereby incorporated herein by reference.

BACKGROUND OF THE INVENTION

1. Field of the Invention

The present invention relates to acoustic wave devices.

2. Description of the Related Art

In the related art, an acoustic wave device is widely used for a filter or the like of a mobile phone. In recent years, as described in U.S. Pat. No. 10,491,192, an acoustic wave device using a bulk wave in a thickness shear mode has been proposed. In the acoustic wave device, a piezoelectric layer is provided on a support body. A pair of electrodes are provided on the piezoelectric layer. The pair of electrodes face each other on the piezoelectric layer, and are connected to mutually different potentials. An alternating current voltage is applied between the electrodes to excite the bulk wave in the thickness shear mode.

For example, an acoustic wave device is an acoustic wave resonator, and is used in a ladder filter. In order to obtain satisfactory characteristics in the ladder filter, it is necessary to increase an electrostatic capacitance ratio between a plurality of the acoustic wave resonators. In this case, it is necessary to increase electrostatic capacitance of some acoustic wave resonators in the ladder filter.

In order to increase the electrostatic capacitance of the acoustic wave resonator, for example, it is necessary to increase a size of the acoustic wave resonator. Therefore, when the acoustic wave resonator is used in the ladder filter, a size of the ladder filter tends to increase. In particular, the size of the ladder filter having the acoustic wave resonator using a bulk wave in a thickness shear mode with small electrostatic capacitance increases.

SUMMARY OF THE INVENTION

Example embodiments of the present invention provide acoustic wave devices each of which are able to obtain a suitable filter waveform without increasing a size of the acoustic wave device when used in a filter device.

An acoustic wave device according to an example embodiment of the present invention includes a first acoustic wave resonator and a second acoustic wave resonator, each including a piezoelectric layer and a functional electrode on the piezoelectric layer, and an acoustic coupling layer laminated between the piezoelectric layer of the first acoustic wave resonator and the piezoelectric layer of the second acoustic wave resonator. Each of the functional electrodes of the first acoustic wave resonator and the second acoustic wave resonator includes at least one pair of electrode fingers. When in each of the first acoustic wave resonator and the second acoustic wave resonator, a thickness of the piezoelectric layer is defined as d and a center-to-center distance between electrode fingers adjacent to each other is defined as p, d/p is about 0.5 or smaller. The first acoustic wave resonator and the second acoustic wave resonator face each other across the acoustic coupling layer.

According to example embodiments of the present invention, it is possible to provide acoustic wave devices each of which are able to obtain a suitable filter waveform without increasing a size of the acoustic wave device when used in a filter device.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Hereinafter, the present invention will be clearly understood by describing specific example embodiments of the present invention with reference to the drawings.

Each example embodiment described in the present specification is merely an example, and configurations can be partially replaced or combined with each other between different example embodiments.

Figure 1:
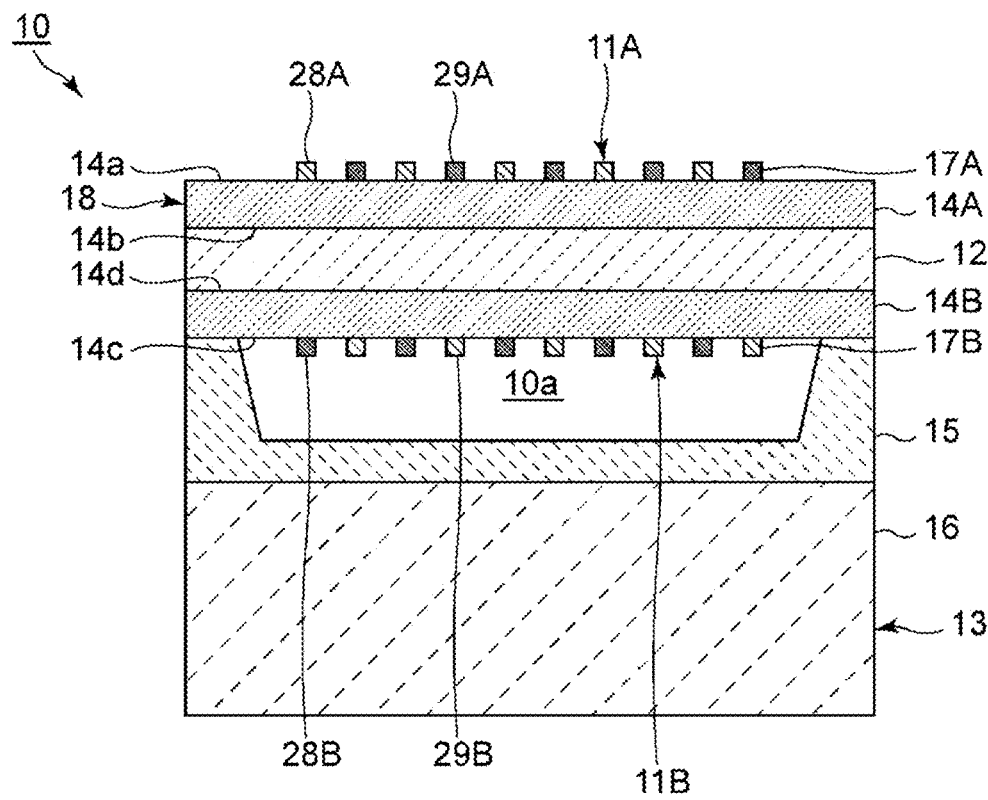
FIG. 1 is a schematic elevational cross-sectional view of an acoustic wave device according to a first example embodiment of the present invention.
Figure 2:
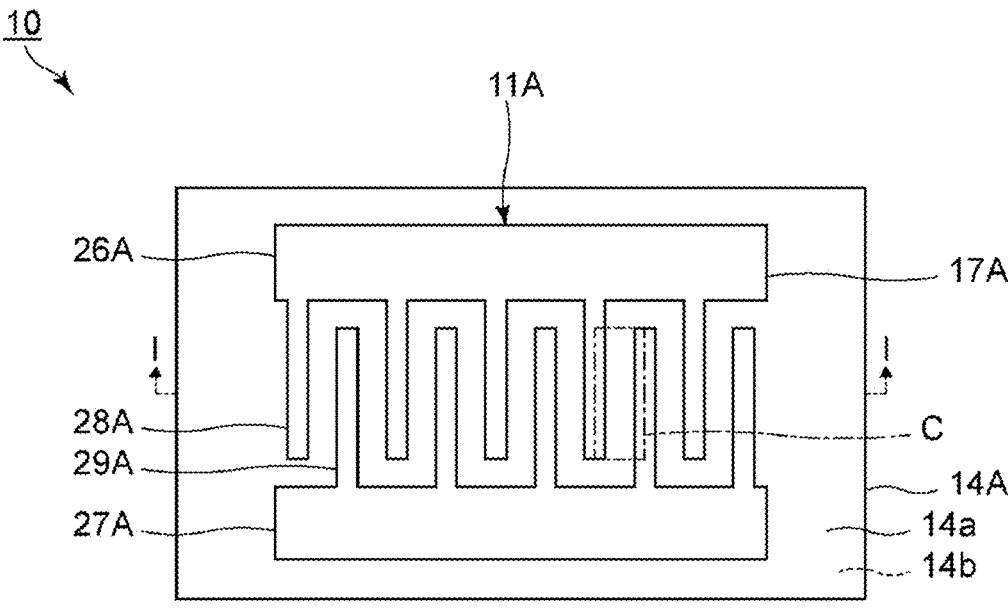
FIG. 2 is a schematic plan view of the acoustic wave device according to the first example embodiment of the present invention.

FIG. 1 is a schematic elevational cross-sectional view of an acoustic wave device according to a first example embodiment of the present invention. FIG. 2 is a schematic plan view of the acoustic wave device according to the first example embodiment. FIG. 1 is a schematic cross-sectional view taken along line I-I in FIG. 2.

An acoustic wave device 10 shown in FIG. 1 is configured such that a thickness shear mode can be used. The acoustic wave device 10 is, for example, a coupled resonator filter. Hereinafter, a configuration of the acoustic wave device 10 will be described.

The acoustic wave device 10 includes a first acoustic wave resonator 11A, a second acoustic wave resonator 11B, an acoustic coupling layer 12, and a support 13. The first acoustic wave resonator 11A and the second acoustic wave resonator 11B face each other across the acoustic coupling layer 12. That is, the first acoustic wave resonator 11A, the acoustic coupling layer 12, and the second acoustic wave resonator 11B define a multilayer body 18. The multilayer body 18 is provided on the support 13.

The second acoustic wave resonator 11B is located on the support 13 side in the first acoustic wave resonator 11A and the second acoustic wave resonator 11B. However, the first acoustic wave resonator 11A may be located on the support 13 side in the first acoustic wave resonator 11A and the second acoustic wave resonator 11B.

The first acoustic wave resonator 11A includes a first piezoelectric layer 14A and a first functional electrode. In the present example embodiment, the first functional electrode is a first IDT electrode 17A. The first piezoelectric layer 14A includes a first main surface 14a and a second main surface 14b. The first main surface 14a and the second main surface 14b face each other. The second main surface 14b is located on the acoustic coupling layer 12 side on the first main surface 14a and the second main surface 14b. The first IDT electrode 17A is provided on the first main surface 14a.

The second acoustic wave resonator 11B includes a second piezoelectric layer 14B and a second functional electrode. In the present example embodiment, the second functional electrode is a second IDT electrode 17B. The second piezoelectric layer 14B includes a first main surface 14c and a second main surface 14d. The first main surface 14c and the second main surface 14d face each other. The second main surface 14d is located on the acoustic coupling layer 12 side in the first main surface 14c and the second main surface 14d. The first main surface 14c is located on the support 13 side on the first main surface 14c and the second main surface 14d. The second IDT electrode 17B is provided on the first main surface 14c.

The acoustic coupling layer 12 is laminated between the second main surface 14b of the first piezoelectric layer 14A in the first acoustic wave resonator 11A and the second main surface 14d of the second piezoelectric layer 14B in the second acoustic wave resonator 11B. For example, the first piezoelectric layer 14A and the second piezoelectric layer 14B are lithium niobate layers such as LiNbO$_3$ layers or lithium tantalate layers such as LiTaO$_3$ layers. As a material for the acoustic coupling layer 12, for example, a polymer such as polyimide (Pi) or carbon-doped oxide (CDO) can be used.

As shown in FIG. 2, the first IDT electrode 17A includes a pair of busbars and a plurality of electrode fingers. Specifically, the pair of busbars include a first busbar 26A and a second busbar 27A. The first busbar 26A and the second busbar 27A face each other. Specifically, the plurality of electrode fingers include a plurality of first electrode fingers 28A and a plurality of second electrode fingers 29A. One end of each of the plurality of first electrode fingers 28A is connected to the first busbar 26A. One end of each of the plurality of first electrode fingers 29A is connected to the second busbar 27A. The plurality of first electrode fingers 28A and the plurality of second electrode fingers 29A are interdigitated with each other.

Hereinafter, the first busbar 26A and the second busbar 27A may be simply referred to as busbars. The first electrode finger 28A and the second electrode finger 29A may be simply referred to as electrode fingers. When an extending direction of the plurality of electrode fingers is defined as an electrode finger extending direction and a direction in which adjacent electrode fingers face each other is defined as an electrode finger facing direction, the electrode finger extending direction and the electrode finger facing direction are orthogonal or substantially orthogonal to each other. That is, when a direction orthogonal or substantially orthogonal to the electrode finger extending direction is defined as an electrode finger orthogonal direction, the electrode finger orthogonal direction and the electrode finger facing direction are parallel or substantially parallel to each other.

Here, the busbar connected to a hot potential will be referred to as a hot potential busbar. The electrode finger connected to the hot potential will be referred to as a hot potential electrode finger. In the present specification, the hot potential indicates a signal potential. Therefore, hereinafter, the hot potential may be referred to as the signal potential. For example, the hot potential busbar will be referred to as a signal potential busbar. The hot potential electrode finger will be referred to as a signal potential electrode finger. On the other hand, the busbar connected to a reference potential will be referred to as a reference potential busbar. The electrode finger connected to the reference potential will be referred to as a reference potential electrode finger.

The first busbar 26A and the plurality of first electrode fingers 28A of the first IDT electrode 17A are connected to the signal potential. Therefore, the first busbar 26A is the signal potential busbar. The first electrode finger 28A is the signal potential electrode finger. Specifically, the first busbar 26A and the first electrode finger 28A are connected to the signal potential on an input side. On the other hand, the second busbar 27A and the plurality of second electrode fingers 29A are connected to the reference potential. Therefore, the second busbar 27A is the reference potential busbar. The second electrode finger 29A is the reference potential electrode finger.

As in the first IDT electrode 17A, the second IDT electrode 17B shown in FIG. 1 includes a pair of busbars and a plurality of electrode fingers. Specifically, the plurality of electrode fingers of the second IDT electrode 17B are a plurality of first electrode fingers 28B and a plurality of second electrode fingers 29B. The plurality of first electrode fingers 28B are the reference potential electrode fingers. On the other hand, the plurality of second electrode fingers 29B are the signal potential electrode fingers. More specifically, the plurality of second electrode fingers 29B are connected to the signal potential on an output side.

The first functional electrode in the first acoustic wave resonator 11A is not necessarily the IDT electrode. The first functional electrode may include at least one pair of the electrode fingers. Similarly, the second functional electrode in the second acoustic wave resonator 11B may include at least one pair of the electrode fingers.

The first acoustic wave resonator 11A and the second acoustic wave resonator 11B are acoustic wave resonators configured such that a thickness shear mode can be used. More specifically, as shown in FIG. 2, the first acoustic wave resonator 11A includes a plurality of excitation regions C. More specifically, when viewed in the electrode finger orthogonal direction, a center-to-center region of the adjacent electrode fingers, which is a region where the adjacent electrode fingers overlap each other, is the excitation region C. Similarly, although not shown, the second acoustic wave resonator 11B also includes the plurality of excitation regions C. In the plurality of excitation regions C of the first acoustic wave resonator 11A and the second acoustic wave resonator 11B, a bulk wave in a thickness shear mode or an acoustic wave of another mode is excited.

In the first acoustic wave resonator 11A, when a thickness of the first piezoelectric layer 14A is defined as d and a center-to-center distance of adjacent electrode fingers is defined as p, d/p is, for example, about 0.5 or smaller. Similarly, in the second acoustic wave resonator 11B, when the thickness of the second piezoelectric layer 14B is defined as d and the center-to-center distance of the adjacent electrode fingers is defined as p, d/p is, for example, about 0.5 or smaller. In this manner, the thickness shear mode is suitably excited in the plurality of excitation regions C of the first acoustic wave resonator 11A and the second acoustic wave resonator 11B.

A characteristic of the present example embodiment is, for example, $d/p \leq$ about 0.5 in both the first acoustic wave resonator 11A and the second acoustic wave resonator 11B, and the first acoustic wave resonator 11A and the second acoustic wave resonator 11B face each other across the acoustic coupling layer 12. In this manner, a filter waveform of the acoustic wave device 10 can be suitably obtained. When the acoustic wave device 10 as the acoustic wave resonator is used in a filter device, the filter waveform can be suitably obtained even in a case of one or a small number of acoustic wave resonators forming the filter device, and a size of the filter device can be reduced. A detailed configuration thereof will be described below with reference to a comparative example.

Figure 3:
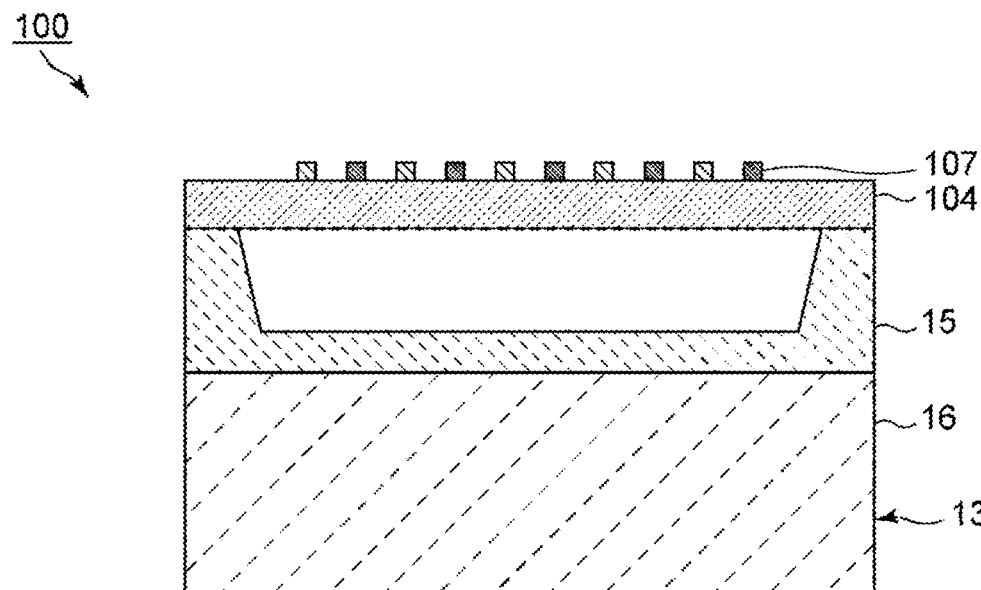
FIG. 3 is a schematic elevational cross-sectional view of an acoustic wave device of a comparative example.

As shown in FIG. 3, the comparative example is different from the first example embodiment in that only one layer of the piezoelectric layer 104 and only one of the IDT electrodes 107 are provided, and in that the acoustic coupling layer 12 is not provided. In the acoustic wave device 100 of the comparative example, the piezoelectric layer 104 is provided on the support 13. The IDT electrode 107 is provided on the piezoelectric layer 104. The acoustic wave device 100 is an acoustic wave resonator.

Figure 4:
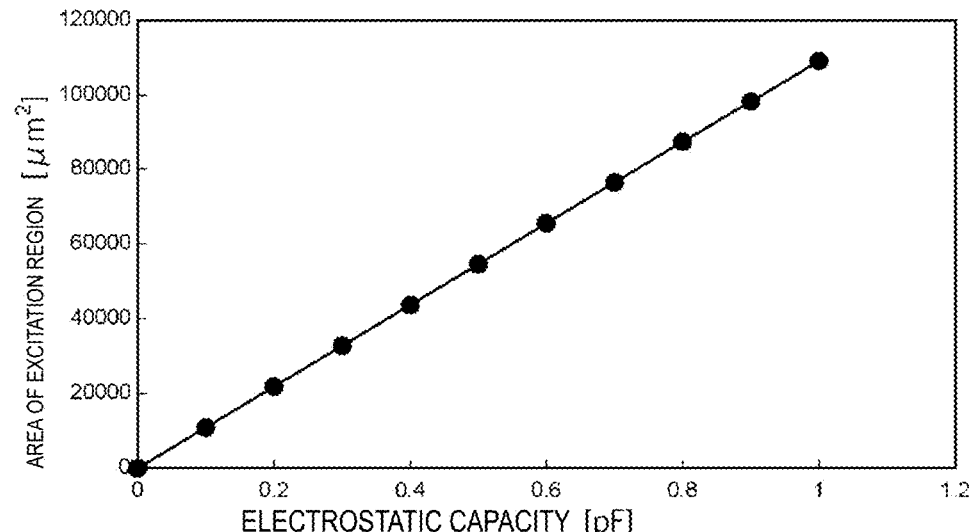
FIG. 4 is a view showing an example of a relationship between electrostatic capacitance and an area of an excitation region in the comparative example.

FIG. 4 is a view showing an example of a relationship between electrostatic capacitance and an area of the excitation region in the comparative example. In the example shown in FIG. 4, the thickness of the piezoelectric layer 104 is set to about 375 nm, the center-to-center distance of the adjacent electrode fingers is set to about 4.8 μm, and the width of each electrode finger is set to about 960 nm. The width of the electrode finger is a dimension of the electrode finger along the electrode finger orthogonal direction.

As shown in FIG. 4, in the comparative example, it can be understood that the area of the excitation region increases as the electrostatic capacitance of the acoustic wave device 100 increases. When the acoustic wave device 100 is used in the filter device, in order to suitably obtain the filter waveform, it is necessary to increase a capacitance ratio between the plurality of acoustic wave resonators 100. However, since the acoustic wave resonator 100 having a large electrostatic capacitance is used, it is more difficult to reduce a size of the filter device.

In contrast, in the first example embodiment shown in FIG. 1, the filter waveform of the acoustic wave device 10 can be suitably obtained. Therefore, when the acoustic wave device 10 as the acoustic wave resonator is used in the filter device, the filter waveform can be suitably obtained even in a case of one or a small number of acoustic wave resonators of the filter device, and the size of the filter device can be progressively reduced. Here, bandpass characteristics of the acoustic wave device 10 will be described below. Design parameters of the acoustic wave device 10 are as follows.

Figure 5:
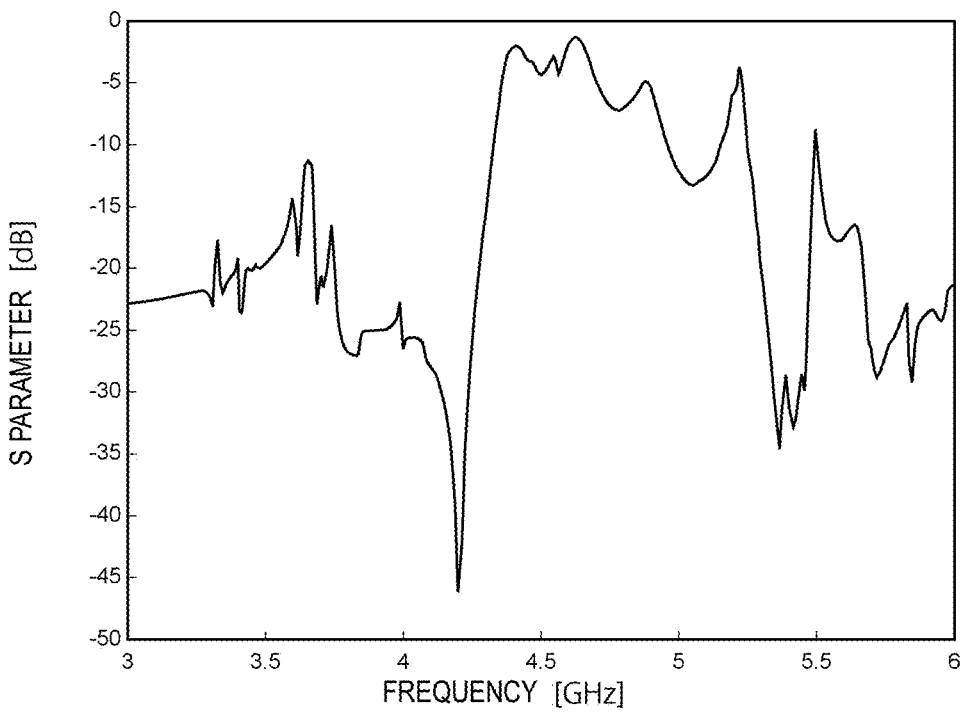
FIG. 5 is a view showing bandpass characteristics of the acoustic wave device according to the first example embodiment of the present invention.

First piezoelectric layer: material . . . Z-cut $LiNbO_3$, thickness . . . about 400 nm First electrode finger and second electrode finger in first acoustic wave resonator: material . . . Al, thickness . . . about 500 nm, width . . . about 960 nm Center-to-center distance p in first acoustic wave resonator: about 4.8 μm Second piezoelectric layer: material . . . Z-cut LiNbO$_3$, thickness . . . about 400 nm First electrode finger and second electrode finger in second acoustic wave resonator: material . . . Al, thickness . . . about 500 nm, width . . . about 960 nm Center-to-center distance p in second acoustic wave resonator: about 4.8 μm Acoustic coupling layer: material . . . SiLK (trademark, a resin manufactured by The Dow Chemical Company), thickness . . . about 650 nm FIG. 5 is a view showing the bandpass characteristics of the acoustic wave device according to the first example embodiment. FIG. 5 shows results of a finite element method (FEM) simulation.

As shown in FIG. 5, it can be understood that the filter waveform can be suitably obtained even in a case of one acoustic wave device 10. That is, in the acoustic wave device 10, a pass band is provided.

As shown in FIG. 1, the first acoustic wave resonator 11A and the second acoustic wave resonator 11B of the acoustic wave device 10 overlap each other in a plan view, and are acoustically coupled by the acoustic coupling layer 12. In this manner, the acoustic wave device 10 functions as a coupled resonator filter. Therefore, the filter waveform can be suitably obtained even in the case of one acoustic wave device 10. Therefore, since the acoustic wave device 10 is used, the filter device can be provided without increasing the size of the filter device.

In the present specification, the plan view means that an object is viewed along a lamination direction of the multilayer body 18 from a direction corresponding to an upper side in FIG. 1. In FIG. 1, for example, the multilayer body 18 side is the upper side of the support 13 side and the multilayer body 18 side. In the present specification, for example, when it is described that two electrodes face each other across the acoustic coupling layer 12, it is assumed that the two electrodes overlap each other in a plan view.

Hereinafter, a configuration in the first example embodiment will be described in more detail.

As shown in FIG. 1, the support 13 includes a support substrate 16 and an insulating layer 15. As a material of the support substrate 16, for example, a semiconductor such as silicon, ceramics such as aluminum oxide, or the like can be used. As a material of the insulating layer 15, an appropriate dielectric such as, for example, silicon oxide or tantalum oxide can be used. The support 13 may include only the support substrate 16.

The multilayer body 18 of the first acoustic wave resonator 11A, the second acoustic wave resonator 11B, and the acoustic coupling layer 12 are provided on the support 13. More specifically, the second piezoelectric layer 14B in the second acoustic wave resonator 11B is provided on the insulating layer 15. The acoustic coupling layer 12 is provided on the second piezoelectric layer 14B. The first piezoelectric layer 14A of the first acoustic wave resonator 11A is provided on the acoustic coupling layer 12.

A recess portion is provided in the insulating layer 15. The multilayer body 18 is provided on the insulating layer 15 to cover the recess portion. In this manner, a hollow portion is provided. The hollow portion is a cavity portion 10a. In the present example embodiment, the support 13 and the multilayer body 18 are disposed such that a portion of the support 13 and a portion of the multilayer body 18 face each other across the cavity portion 10a. The recess portion in the support 13 may be provided over the insulating layer 15 and the support substrate 16. Alternatively, the recess portion provided only in the support substrate 16 may be closed by the insulating layer 15. The recess portion may be provided in the second piezoelectric layer 14B in the multilayer body 18. The cavity portion 10a may be a through hole provided in the support 13.

In a plan view, the cavity portion 10a may be provided at a position overlapping at least a portion of the first IDT electrode 17A as the first functional electrode and at least a portion of the second IDT electrode 17B as the second functional electrode. In the present example embodiment, the second IDT electrode 17B is located inside the cavity portion 10a.

The cavity portion 10a is not necessarily provided. In this case, for example, the second IDT electrode 17B may be embedded in the insulating layer 15. Alternatively, the support 13 is not necessarily provided.

Although not shown, the first acoustic wave resonator 11A may be connected to the input potential and the reference potential by an appropriate layout electrode or the like. Similarly, the second acoustic wave resonator 11B may be connected to the output potential and the reference potential by using an appropriate layout electrode or the like.

As shown in FIG. 1, the acoustic coupling layer 12 is sandwiched between the first piezoelectric layer 14A and the second piezoelectric layer 14B. It is preferable that the acoustic impedance of the acoustic coupling layer 12 is lower than the acoustic impedance of the adjacent layer. Specifically, it is preferable that the acoustic impedance of the acoustic coupling layer 12 is lower than the acoustic impedance of at least one of the first piezoelectric layer 14A and the second piezoelectric layer 14B. It is more preferable that the acoustic impedance of the acoustic coupling layer 12 is lower than the acoustic impedance of both the first piezoelectric layer 14A and the second piezoelectric layer 14B. As the acoustic impedance of the acoustic coupling layer 12 becomes lower, coupling strength of modes generated in the first acoustic wave resonator 11A and the second acoustic wave resonator 11B becomes higher. In this manner, the filter waveform can be more reliably obtained.

Figure 6:
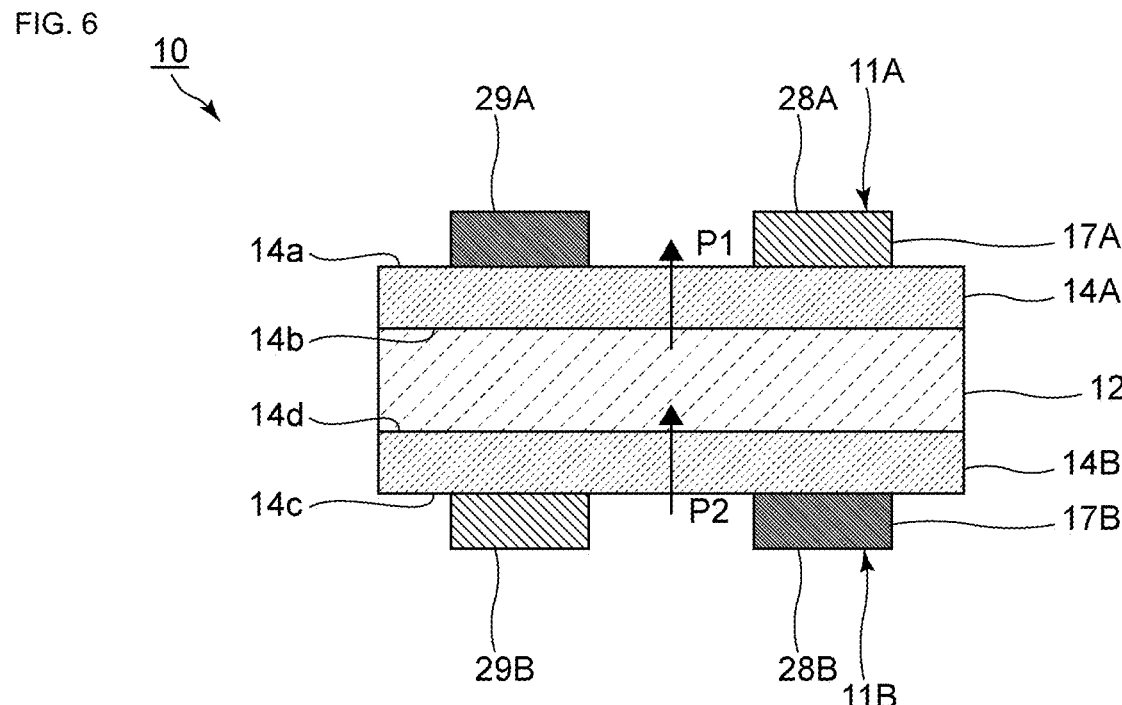
FIG. 6 is a schematic elevational cross-sectional view showing a vicinity of a pair of electrode fingers of a first IDT electrode and a pair of electrode fingers of a second IDT electrode in the first example embodiment of the present invention.

FIG. 6 is a schematic elevational cross-sectional view showing a vicinity of a pair of electrode fingers of the first IDT electrode and a pair of electrode fingers of the second IDT electrode in the first example embodiment. An arrow P1 in FIG. 6 indicates a polarization direction of the first piezoelectric layer 14A, that is, a polarization axis direction. An arrow P2 indicates a polarization axis direction of the second piezoelectric layer 14B.

In the present example embodiment, the polarization axis direction of the first piezoelectric layer 14A and the polarization axis direction of the second piezoelectric layer 14B are the same direction. However, the polarization axis direction of the first piezoelectric layer 14A and the polarization axis direction of the second piezoelectric layer 14B may be directions opposite to each other.

The first electrode finger 28A in the first IDT electrode 17A and the first electrode finger 28B in the second IDT electrode 17B face each other across the acoustic coupling layer 12. The second electrode finger 29A in the first IDT electrode 17A and the second electrode finger 29B in the second IDT electrode 17B face each other across the acoustic coupling layer 12. That is, the signal potential electrode finger in the first IDT electrode 17A and the reference potential electrode finger in the second IDT electrode 17B face each other across the acoustic coupling layer 12.

A disposition relationship between the electrode fingers in the first acoustic wave resonator and the second acoustic wave resonator is not limited to the above-described example. For example, at least one signal potential electrode finger of the first acoustic wave resonator and at least one signal potential electrode finger of the second acoustic wave resonator may face each other across the acoustic coupling layer. At least one reference potential electrode finger of the first acoustic wave resonator and at least one reference potential electrode finger of the second acoustic wave resonator may face each other across the acoustic coupling layer. Alternatively, as in the first example embodiment, at least one signal potential electrode finger of the first acoustic wave resonator and at least one reference potential electrode finger of the second acoustic wave resonator may face each other across the acoustic coupling layer.

Hereinafter, first to third modified examples of the first example embodiment will be described. Each modified example is different from the first example embodiment in a relationship between the polarization axis directions of the first piezoelectric layer and the second piezoelectric layer, or only in a potential relationship between the busbars facing each other across the acoustic coupling layer and between the electrode fingers. In the first to third modified examples, as in the first example embodiment, the filter waveform can be suitably obtained even in a case of one acoustic wave device. Therefore, the filter device can be provided without increasing the size of the filter device even when any acoustic wave device in the first to third modified examples is used.

Figure 7:
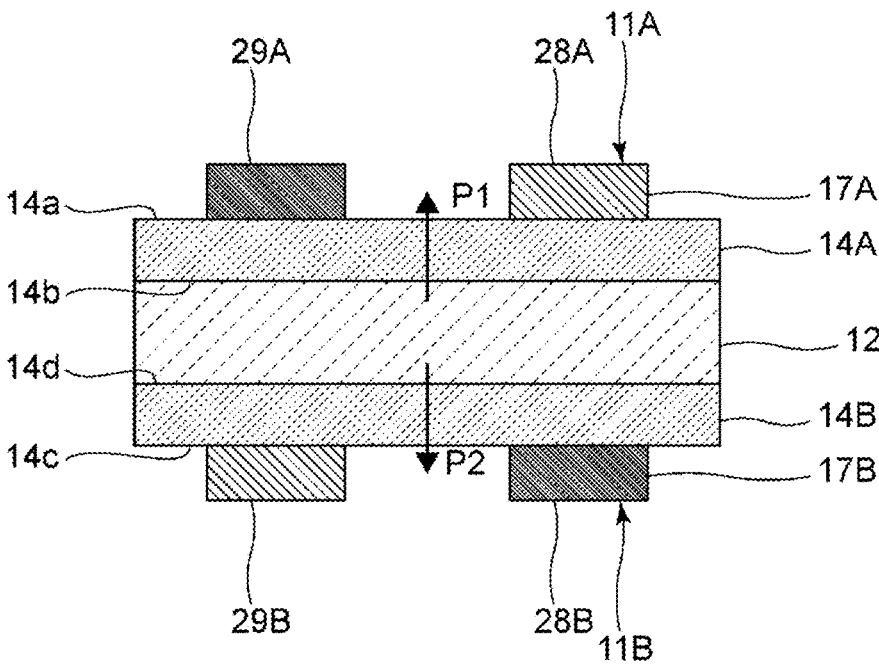
FIG. 7 is a schematic elevational cross-sectional view showing a vicinity of a pair of electrode fingers of a first IDT electrode and a pair of electrode fingers of a second IDT electrode in a first modified example of the first example embodiment of the present invention.

The first modified example shown in FIG. 7 is different from the first example embodiment only in a relationship between the polarization axis directions of the first piezoelectric layer 14A and the second piezoelectric layer 14B. Specifically, the polarization axis direction of the first piezoelectric layer 14A and the polarization axis direction of the second piezoelectric layer 14B are directions opposite to each other.

Figure 8:
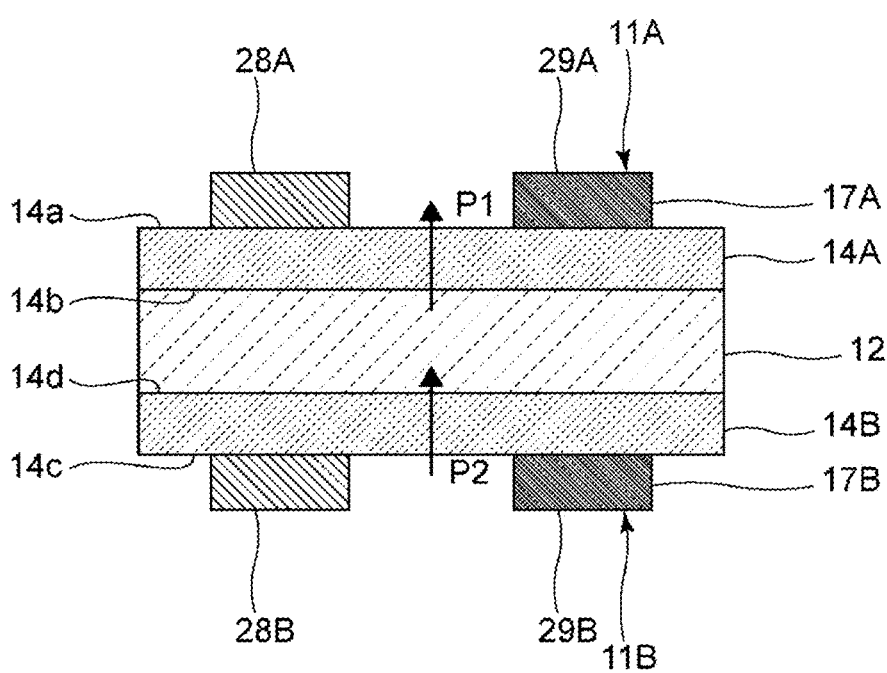
FIG. 8 is a schematic elevational cross-sectional view showing a vicinity of a pair of electrode fingers of a first IDT electrode and a pair of electrode fingers of a second IDT electrode in a second modified example of the first example embodiment of the present invention.

The second modified example shown in FIG. 8 is different from the first example embodiment only in a potential relationship between the busbars facing each other across the acoustic coupling layer 12, and between the electrode fingers. Specifically, in the present modified example, the first electrode finger 28B of the second IDT electrode 17B is the signal potential electrode finger. The second electrode finger 29B of the second IDT electrode 17B is the reference potential electrode finger.

In the present modified example, the signal potential busbar of the first IDT electrode 17A and the signal potential busbar of the second IDT electrode 17B face each other across the acoustic coupling layer 12. The signal potential electrode finger of the first IDT electrode 17A and the signal potential electrode finger of the second IDT electrode 17B face each other across the acoustic coupling layer 12. On the other hand, the reference potential busbar of the first IDT electrode 17A and the reference potential busbar of the second IDT electrode 17B face each other across the acoustic coupling layer 12. The reference potential electrode finger of the first IDT electrode 17A and the reference potential electrode finger of the second IDT electrode 17B face each other across the acoustic coupling layer 12.

Figure 9:
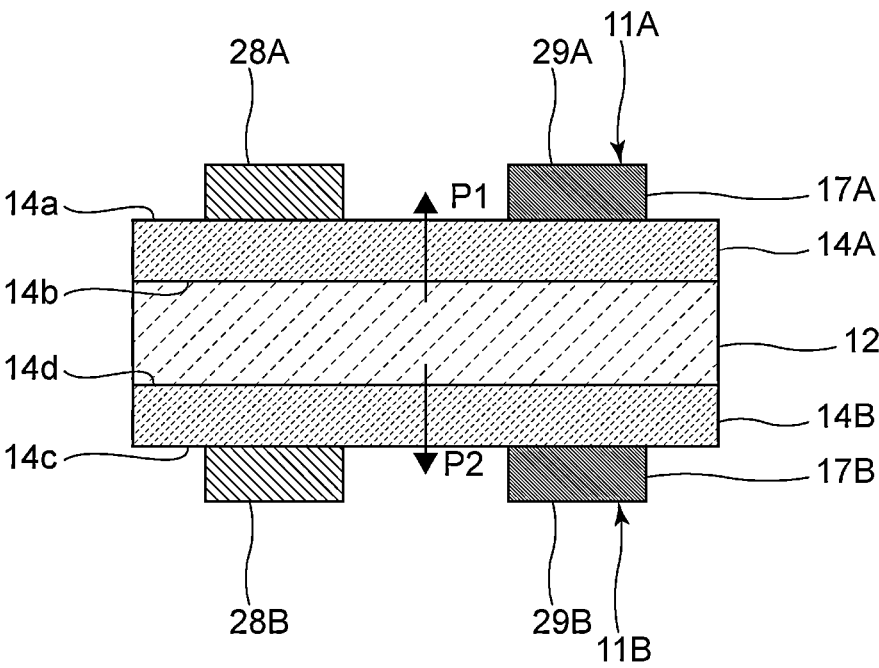
FIG. 9 is a schematic elevational cross-sectional view showing a vicinity of a pair of electrode fingers of a first IDT electrode and a pair of electrode fingers of a second IDT electrode in a third modified example of the first example embodiment of the present invention.

The third modified example shown in FIG. 9 is different from the first example embodiment in a relationship between the polarization axis directions of the first piezoelectric layer 14A and the second piezoelectric layer 14B, and only in a potential relationship between the busbars facing each other across the acoustic coupling layer 12, and between the electrode fingers. That is, the third modified example is different from the second modified example only in the relationship between the polarization axis directions of the first piezoelectric layer 14A and the second piezoelectric layer 14B.

The bandpass characteristics of the first example embodiment and the first modified example are compared. Similarly, the bandpass characteristics of the second modified example and the third modified example are compared. Design parameters in the acoustic wave device of the first example embodiment and the first to third modified examples are set to be the same or substantially the same as design parameters used when the bandpass characteristics shown in FIG. 5 are derived. The bandpass characteristics of each acoustic wave device are derived by the FEM simulation.

Figure 10:
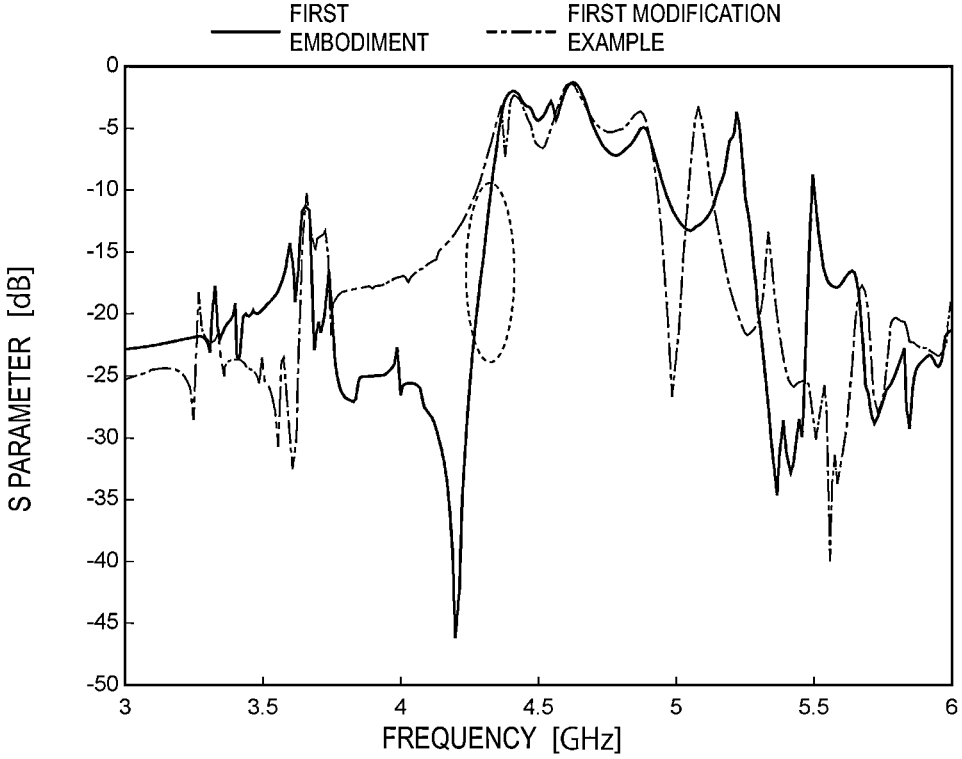
FIG. 10 is a view showing bandpass characteristics in the first example embodiment and the first modified example of the present invention.
Figure 11:
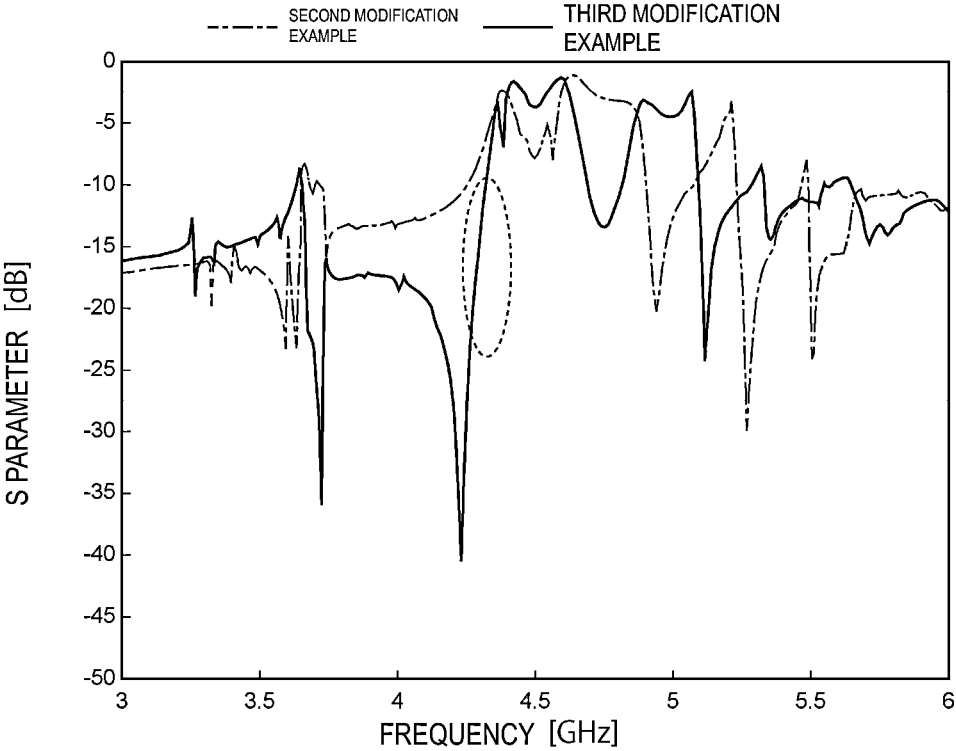
FIG. 11 is a view showing bandpass characteristics in the second modified example and the third modified example of the first example embodiment of the present invention.

FIG. 10 is a view showing the bandpass characteristics in the first example embodiment and the first modified example. FIG. 11 is a view showing the bandpass characteristics in the second modified example and the third modified example of the first example embodiment.

As shown in FIG. 10, it can be understood that the filter waveform can be obtained in both of the first example embodiment and the first modified example. As surrounded and shown by a broken line in FIG. 10, in the first example embodiment, steepness can be increased. In the present specification, the increased steepness means that a change amount of a frequency is smaller than a change amount of a certain constant attenuation in the vicinity of an end portion of the pass band.

In the first example embodiment and the first modified example, the signal potential electrode finger of the first acoustic wave resonator and the reference potential electrode finger of the second acoustic wave resonator face each other across the acoustic coupling layer 12. In this case, as in the first example embodiment, it is preferable that the polarization axis direction of the first piezoelectric layer 14A and the polarization axis direction of the second piezoelectric layer 14B are the same direction. In this manner, the steepness can be increased.

As shown in FIG. 11, it can be understood that the filter waveform can be obtained in both of the second modified example and the third modified example. As surrounded and shown by a broken line in FIG. 11, in the third modified example, the steepness can be increased.

In the second modified example and the third modified example, the signal potential electrode finger of the first acoustic wave resonator and the signal potential electrode finger of the second acoustic wave resonator face each other across the acoustic coupling layer 12. The reference potential electrode finger of the first acoustic wave resonator and the reference potential electrode finger of the second acoustic wave resonator face each other across the acoustic coupling layer 12. In this case, as in the third modified example, it is preferable that the polarization axis direction of the first piezoelectric layer 14A and the polarization axis direction of the second piezoelectric layer 14B are directions opposite to each other. In this manner, the steepness can be increased.

Incidentally, the first busbar 26A in the first acoustic wave resonator 11A shown in FIG. 2 is the signal potential busbar. The second busbar 27A is the reference potential busbar. On the other hand, in the second acoustic wave resonator 11B shown in FIG. 1, the busbar to which the first electrode finger 28B is connected is the reference potential busbar.

The busbar to which the second electrode finger 29B is connected is the signal potential busbar. The signal potential busbar of the first acoustic wave resonator 11A and the reference potential busbar of the second acoustic wave resonator 11B face each other across the acoustic coupling layer 12.

The signal potential electrode finger of the first acoustic wave resonator 11A and the reference potential electrode finger of the second acoustic wave resonator 11B face each other across the acoustic coupling layer 12. Each electrode finger includes a base end portion and a tip portion. The base end portion indicates a portion connected to the busbar in the electrode finger. In the first example embodiment, a portion from the base end portion to the tip portion of the signal potential electrode finger of the first acoustic wave resonator 11A and a portion from the base end portion to the tip portion of the reference potential electrode finger of the second acoustic wave resonator 11B face each other across the acoustic coupling layer 12. The above-described electrode fingers do not necessarily need to face each other across the acoustic coupling layer 12 from the base end portion to the tip portion.

The reference potential busbar of the first acoustic wave resonator 11A and the signal potential busbar of the second acoustic wave resonator 11B face each other across the acoustic coupling layer 12. The reference potential electrode finger of the first acoustic wave resonator 11A and the signal potential electrode finger of the second acoustic wave resonator 11B face each other across the acoustic coupling layer 12. Therefore, in the first example embodiment, a portion from the base end portion to the tip portion of the reference potential electrode finger of the first acoustic wave resonator 11A and a portion from the base end portion to the tip portion of the signal potential electrode finger of the second acoustic wave resonator 11B face each other across the acoustic coupling layer 12.

In the acoustic wave device 10, the signal potential busbar and the reference potential busbar of the first acoustic wave resonator 11A and the second acoustic wave resonator 11B face each other across the acoustic coupling layer 12. The reference potential busbars of the first acoustic wave resonator 11A and the second acoustic wave resonator 11B may face each other across the acoustic coupling layer 12. This example will be described according to a second example embodiment of the present invention.

Figure 12:
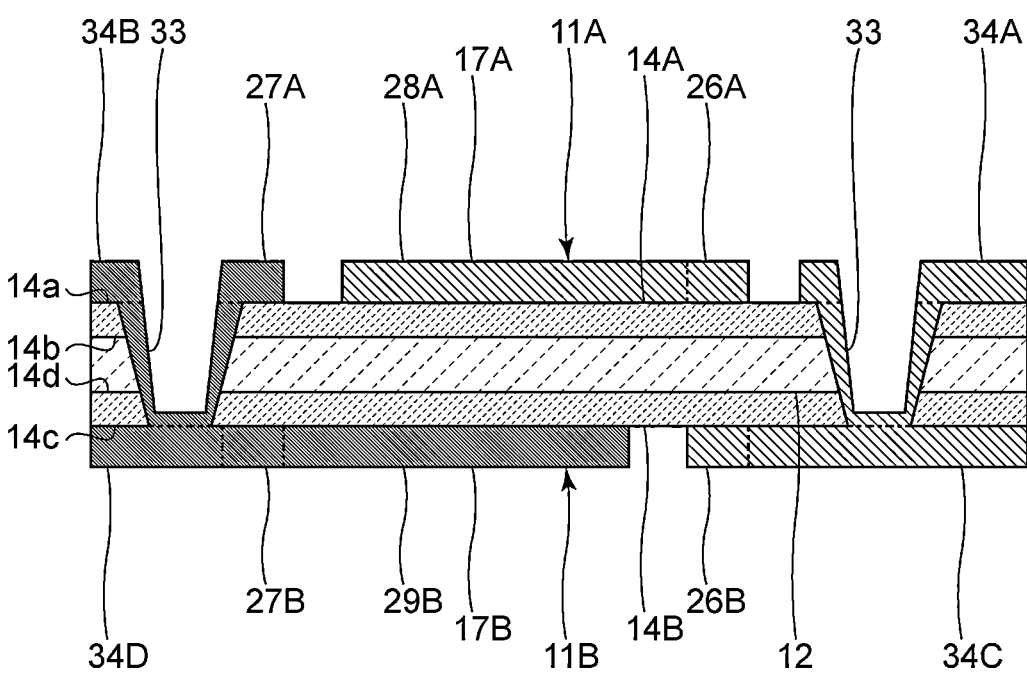
FIG. 12 is a schematic cross-sectional view taken along an electrode finger extending direction of an acoustic wave device according to a second example embodiment of the present invention.
Figure 13:
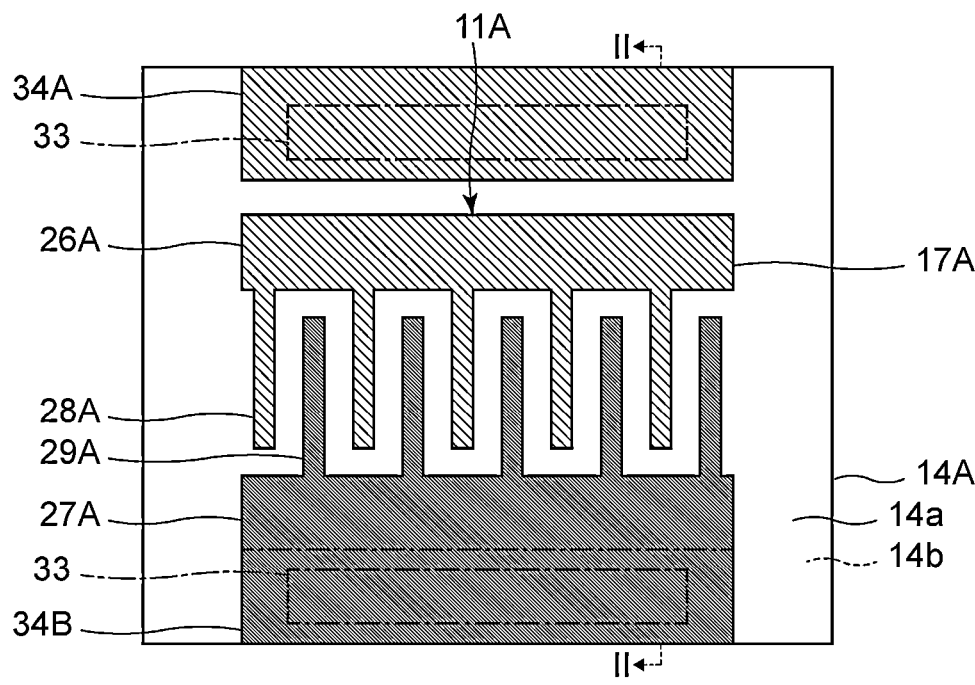
FIG. 13 is a schematic plan view of the acoustic wave device according to the second example embodiment of the present invention.

FIG. 12 is a schematic cross-sectional view along an electrode finger extending direction of an acoustic wave device according to the second example embodiment. FIG. 13 is a schematic plan view of the acoustic wave device according to the second example embodiment. FIG. 12 is a schematic cross-sectional view taken along line II-II in FIG. 13. One-dot chain lines in FIGS. 12 and 13 indicate a boundary between the electrodes. In FIG. 13, each electrode is shown with hatching.

As shown in FIG. 12, the present example embodiment is different from the first example embodiment in a potential relationship between the busbars of the first IDT electrode 17A and the second IDT electrode 17B, which face each other across the acoustic coupling layer 12. The present example embodiment is different from the first example embodiment in that the acoustic wave device includes a plurality of through via electrodes 33 and a plurality of connection electrodes. The through via electrode 33 is provided to penetrate the first piezoelectric layer 14A, the acoustic coupling layer 12, and the second piezoelectric layer 14B. The acoustic wave device of the present example embodiment has the same or substantially the same configuration as that of the acoustic wave device 10 of the first example embodiment, except for the above-described point.

In the first acoustic wave resonator 11A, the first busbar 26A of the first IDT electrode 17A is the signal potential busbar. The second busbar 27A of the first IDT electrode 17A is the reference potential busbar. In the second acoustic wave resonator 11B, the first busbar 26B of the second IDT electrode 17B is the signal potential busbar. The second busbar 27B of the second IDT electrode 17B is the reference potential busbar.

The first busbar 26A defining and functioning as the signal potential busbar of the first acoustic wave resonator 11A, and the first busbar 26B defining and functioning as the signal potential busbar of the second acoustic wave resonator 11B face each other across the acoustic coupling layer 12. The second busbar 27A defining and functioning as the reference potential busbar in the first acoustic wave resonator 11A and the second busbar 27B defining and functioning as the reference potential busbar in the second acoustic wave resonator 11B face each other across the acoustic coupling layer 12.

The first electrode finger 28A defining and functioning as the signal potential electrode finger of the first acoustic wave resonator 11A and the second electrode finger 29B defining and functioning as the reference potential electrode finger of the second acoustic wave resonator 11B face each other across the acoustic coupling layer 12. The vicinity of the base end portion in the first electrode finger 28A does not face the second electrode finger 29B across the acoustic coupling layer 12. That is, the vicinity of the base end portion in the first electrode finger 28A does not overlap the second electrode finger 29B in a plan view.

Although not shown, the reference potential electrode finger of the first acoustic wave resonator 11A and the signal potential electrode finger of the second acoustic wave resonator 11B face each other across the acoustic coupling layer 12. The vicinity of the base end portion in the reference potential electrode finger of the first acoustic wave resonator 11A does not face the signal potential electrode finger of the second acoustic wave resonator 11B across the acoustic coupling layer 12.

As shown in FIG. 12, a first connection electrode 34A and a second connection electrode 34B are provided as the plurality of connection electrodes, on the first main surface 14a of the first piezoelectric layer 14A. A third connection electrode 34C and a fourth connection electrode 34D are provided on the first main surface 14c of the second piezoelectric layer 14B. The plurality of connection electrodes connect the acoustic wave device to the outside. In the present example embodiment, the first busbar 26A of the first acoustic wave resonator 11A is connected to an input potential by a wire (not shown). The other busbars are connected to an output potential or the reference potential with each connection electrode interposed therebetween.

More specifically, the third connection electrode 34C is connected to the first busbar 26B of the second acoustic wave resonator 11B. The fourth connection electrode 34D is connected to the second busbar 27B of the second acoustic wave resonator 11B. In the present example embodiment, the third connection electrode 34C and the first busbar 26B are integrally provided by using the same material. The fourth connection electrode 34D and the second busbar 27B are integrally provided by using the same material. However, different materials may be used for the third connection electrode 34C and the first busbar 26B, and for the fourth connection electrode 34D and the second busbar 27B.

Each of the plurality of through via electrodes 33 is provided to extend to the third connection electrode 34C or the fourth connection electrode 34D. Each of the plurality of through via electrodes 33 is electrically connected to the first busbar 26B or the second busbar 27B of the second acoustic wave resonator 11B with the third connection electrode 34C or the fourth connection electrode 34D interposed therebetween.

The through via electrode 33 connected to the third connection electrode 34C is connected to the first connection electrode 34A. The first busbar 26B of the second acoustic wave resonator 11B is electrically connected to the output potential with the third connection electrode 34C, the through via electrode 33, and the first connection electrode 34A interposed therebetween. In this manner, an area of the layout electrode to connect the second acoustic wave resonator 11B to the output potential can be reduced. Therefore, the size of the acoustic wave device can be reduced.

On the other hand, the through via electrode 33 connected to the fourth connection electrode 34D is connected to the second busbar 27A of the first acoustic wave resonator 11A and the second connection electrode 34B. Therefore, the first acoustic wave resonator 11A is connected to the reference potential with the through via electrode 33 and the second connection electrode 34B interposed therebetween. The second acoustic wave resonator 11B is connected to the reference potential with the fourth connection electrode 34D, the through via electrode 33, and the second connection electrode 34B interposed therebetween.

One through via electrode 33 in the plurality of through via electrodes 33 and the first connection electrode 34A are integrally made of the same material. The other one through via electrode 33, the second busbar 27A, and the second connection electrode 34B are integrally made of the same material. One through via electrode 33 in the plurality of through via electrodes 33, the first connection electrode 34A, the other through via electrode 33, the second busbar 27A, and the second connection electrode 34B may be made of different materials.

In the present example embodiment, as in the first example embodiment, the filter waveform can be suitably obtained even in a case of one acoustic wave device. Therefore, since the acoustic wave device according to the present example embodiment is used, the filter device can be formed without increasing the size of the filter device.

Figure 14:
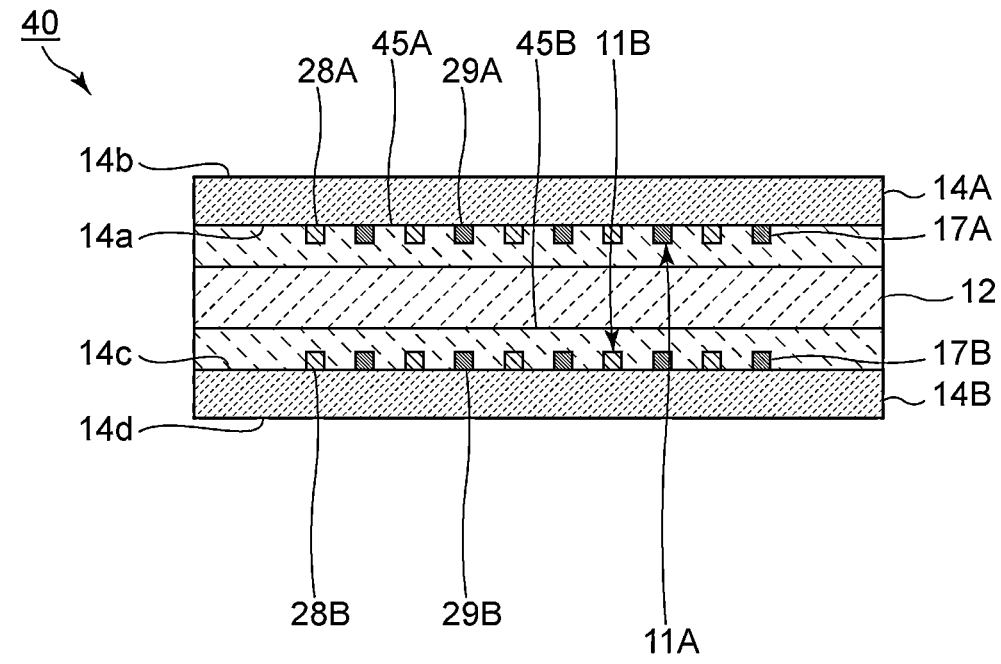
FIG. 14 is a schematic elevational cross-sectional view of an acoustic wave device according to a third example embodiment of the present invention.

FIG. 14 is a schematic elevational cross-sectional view of an acoustic wave device according to a third example embodiment of the present invention.

The present example embodiment is different from the first example embodiment in that a dielectric film is provided between the acoustic coupling layer 12 and each acoustic wave resonator. The present example embodiment is different from the first example embodiment in a direction of the main surface of the piezoelectric layer provided with the IDT electrode. Furthermore, the present example embodiment is different from the first example embodiment in that a support is not provided. An acoustic wave device 40 of the present example embodiment has the same or substantially the same configuration as that of the acoustic wave device 10 of the first example embodiment, except for the above-described point.

On the first main surface 14a and the second main surface 14b of the first piezoelectric layer 14A, the first main surface 14a is located on the acoustic coupling layer 12 side. A first dielectric film 45A is provided between the first main surface 14a of the first piezoelectric layer 14A and the acoustic coupling layer 12. A first IDT electrode 17A is provided on the first main surface 14a. The first IDT electrode 17A is embedded in the first dielectric film 45A.

On the first main surface 14c and the second main surface 14d of the second piezoelectric layer 14B, the first main surface 14c is located on the acoustic coupling layer 12 side. A second dielectric film 45B is provided between the first main surface 14c of the second piezoelectric layer 14B and the acoustic coupling layer 12. A second IDT electrode 17B is provided on the first main surface 14c. The second IDT electrode 17B is embedded in the second dielectric film 45B. The acoustic coupling layer 12 is laminated between the first dielectric film 45A and the second dielectric film 45B.

As materials for the first dielectric film 45A and the second dielectric film 45B, for example, silicon oxide or silicon nitride can be used.

The first acoustic wave resonator 11A and the second acoustic wave resonator 11B overlap each other in a plan view. The first acoustic wave resonator 11A and the second acoustic wave resonator 11B are acoustically coupled by the acoustic coupling layer 12. In this manner, the acoustic wave device 40 defines and functions as a coupled resonator filter. Therefore, even in a case of one acoustic wave device 40, the filter waveform can be suitably obtained. Therefore, since the acoustic wave device 40 is used, the filter device can be provided without increasing the size of the filter device.

Hereinafter, the bandpass characteristics of the acoustic wave device 40 will be described. The material of the acoustic coupling layer 12 is changed to compare the bandpass characteristics. Specifically, for example, when SiN is used as the material of the acoustic coupling layer 12 and when SiLK (trademark, a resin manufactured by The Dow Chemical Company) is used, the bandpass characteristics are derived by the FEM simulation.

Figure 15:
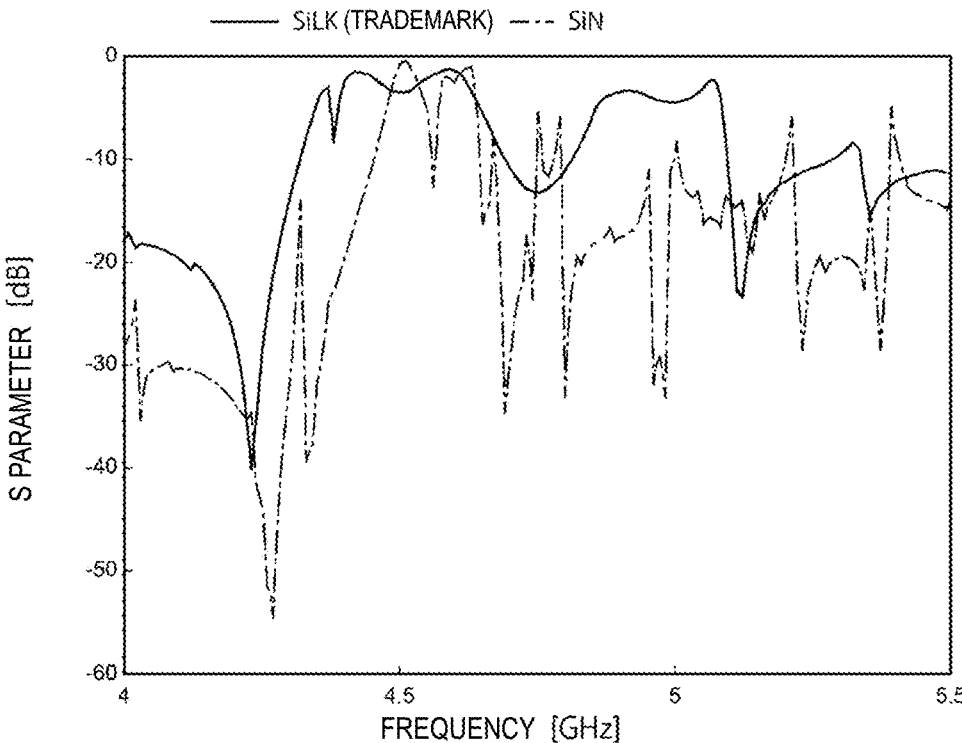
FIG. 15 is a view showing bandpass characteristics in each case of using different materials for an acoustic coupling layer in the third example embodiment of the present invention.

FIG. 15 is a view showing the bandpass characteristics in each case where the material of the acoustic coupling layer is changed in the third example embodiment.

As shown in FIG. 15, it can be understood that the filter waveform can be obtained in any case where the material of the acoustic coupling layer 12 is changed. When the material of the acoustic coupling layer 12 is SiLK (trademark), it can be understood that the pass band is wide. The reason for this is that a dielectric constant of SiLK (trademark) is low and acoustic impedance is low.

It is preferable that the acoustic impedance of the acoustic coupling layer 12 is lower than the acoustic impedance of at least one acoustic impedance of the first dielectric film 45A and the second dielectric film 45B. It is more preferable that the acoustic impedance of the acoustic coupling layer 12 is lower than the acoustic impedance of both of the first dielectric film 45A and the second dielectric film 45B. As the acoustic impedance of the acoustic coupling layer 12 becomes lower, coupling strength of modes generated in the first acoustic wave resonator 11A and the second acoustic wave resonator 11B becomes higher. In this manner, the filter waveform can be more reliably obtained.

Table 1 shows examples of materials for the first piezoelectric layer 14A, the second piezoelectric layer 14B, the first dielectric film 45A, the second dielectric film 45B, and the acoustic coupling layer 12. The acoustic impedance of SiLK (trademark) or CDO is low. Therefore, SiLK (trademark) or CDO is suitable as the material for the acoustic coupling layer 12.

TABLE 1

| | Material | Density [g/cm³] | Vertical wave acoustic velocity [m/s] | Horizontal wave acoustic velocity [m/s] | Vertical wave acoustic impedance Z [MR] | Horizontal wave acoustic impedance Z [MR] |
|---|---|---|---|---|---|---|
| First piezoelectric layer | LiNbO₃ | 4.63 | 6940 | 3600 | 32.1 | 16.7 |
| Second piezoelectric layer | LiTaO₃ | 7.45 | 6085 | 3568 | 45.3 | 26.6 |
| First dielectric film | SiO² | 2.2 | 5943 | 3765 | 13.2 | 8.3 |
| Second dielectric film | Si₃N₄ | 3.2 | 10767 | 5942 | 34.4 | 19 |
| Acoustic coupling layer | SiLK (trademark) | 1.13 | 1960 | 1226 | 2.2 | 1.4 |
| | CDO40 | 1.16 | 2334 | 1459 | 2.7 | 1.7 |
| | CDO26 | 1.43 | 3737 | 2336 | 5.3 | 3.3 |

In the present example embodiment, the acoustic coupling layer 12 is a dielectric layer including a single layer. The acoustic coupling layer 12 may be a multilayer film. In this case, it is preferable that the acoustic impedance becomes lower as the layer is farther from the first piezoelectric layer 14A and the second piezoelectric layer 14B in the acoustic coupling layer 12.

The acoustic wave device 40 may include the support 13 shown in FIG. 1.

In this case, a multilayer body including the first acoustic wave resonator 11A, the second acoustic wave resonator 11B, the first dielectric film 45A, the second dielectric film 45B, and the acoustic coupling layer 12 may be provided on the support 13. The second piezoelectric layer 14B may be provided on the support 13. Alternatively, the first piezoelectric layer 14A may be provided on the support 13.

As described above, acoustic wave devices according to example embodiments of the present invention can be used in the filter device. This example will be described below.

Figure 16:
FIG. 16 is a schematic circuit diagram of a filter device according to a fourth example embodiment of the present invention.
Figure 16:
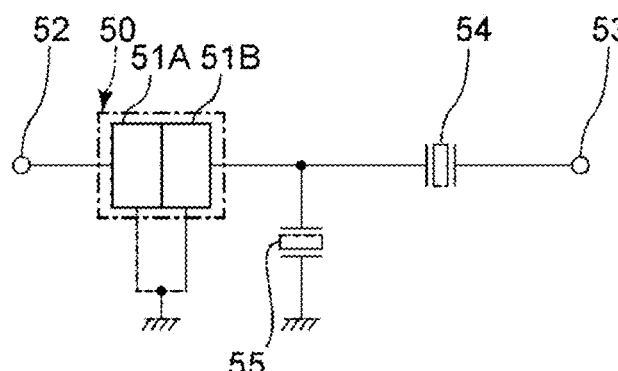

FIG. 16 is a schematic circuit diagram of a filter device according to a fourth example embodiment of the present invention.

A filter device 59 includes an input terminal 52, an output terminal 53, an acoustic wave device 50, an acoustic wave resonator 54, and an acoustic wave resonator 55. The acoustic wave device 50 is an acoustic wave device according to an example embodiment of the present invention. For example, the acoustic wave device 50 has any one of configurations of the first to third example embodiments. Therefore, the acoustic wave device 50 includes a first acoustic wave resonator 51A, a second acoustic wave resonator 51B, and the acoustic coupling layer. In FIG. 16, the acoustic wave device 50, the first acoustic wave resonator 51A, and the second acoustic wave resonator 51B are each schematically shown by using a rectangular shape.

For example, the input terminal 52 and the output terminal 53 may be electrode pads, or may be wires. In the present example embodiment, one of the input terminals 52 and the output terminals 53 is an antenna terminal. The antenna terminal is connected to an antenna.

The acoustic wave device 50 and the acoustic wave resonator 54 are connected in series to each other between the input terminal 52 and the output terminal 53. The acoustic wave resonator 55 is connected between a connection point of the acoustic wave device 50 and the acoustic wave resonator 54, and the reference potential.

The first acoustic wave resonator 51A in the acoustic wave device 50 is directly connected to the input terminal 52. The second acoustic wave resonator 51B is indirectly connected to the output terminal 53 with the acoustic wave resonator 54 interposed therebetween. The first acoustic wave resonator 51A and the second acoustic wave resonator 51B are connected to the reference potential.

The circuit configuration shown in FIG. 16 is an example, and the circuit configuration of the filter device 59 is not limited to the above-described example. The filter device 59 may include the acoustic wave device 50 and at least one resonator other than the first acoustic wave resonator 51A and the second acoustic wave resonator 51B.

The filter waveform can be suitably obtained by a small number of resonators including the acoustic wave device 50. Therefore, it is difficult to increase the size of the filter device 59.

Hereinafter, the thickness shear mode will be described in detail by using an example in which the acoustic wave device is one acoustic wave resonator. The "electrode" in the IDT electrode (to be described later) corresponds to the electrode finger. The support in the following example corresponds to a support substrate of an example embodiment of the present invention. Hereinafter, the signal potential may be referred to as a hot potential.

The reference potential may be referred to as a ground potential.

Figure 17A:
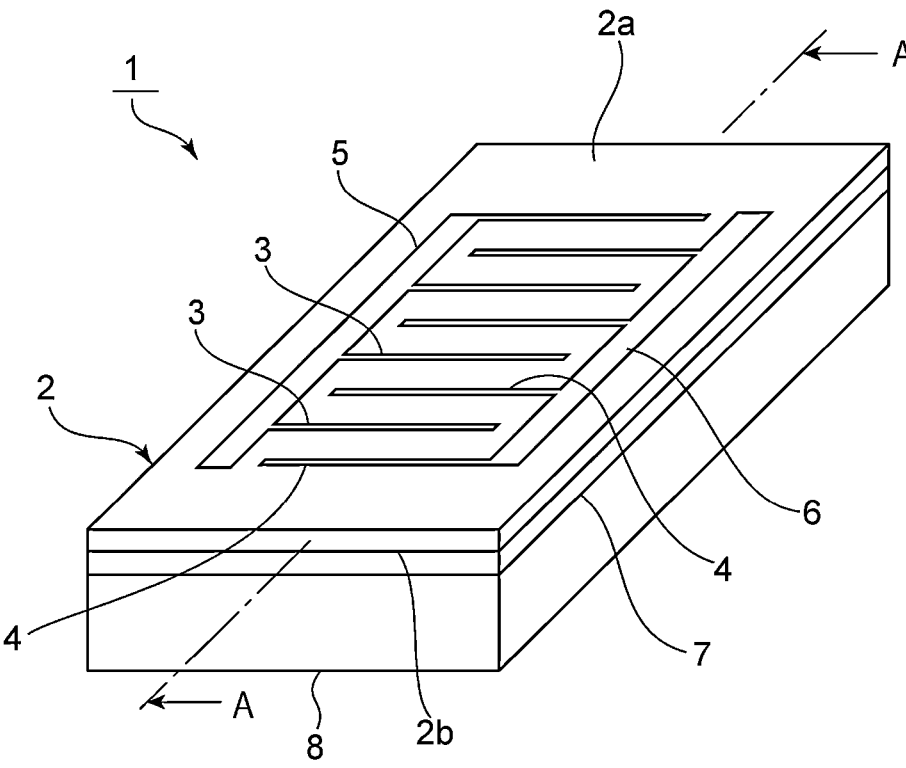
FIG. 17A is a schematic perspective view showing an appearance of an acoustic wave device using a bulk wave in a thickness shear mode.
Figure 17B:
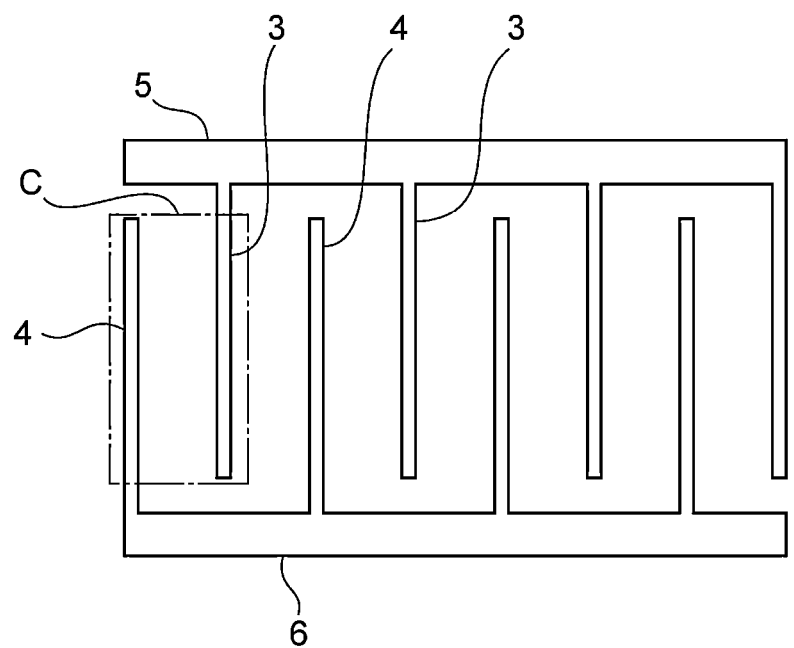
FIG. 17B is a plan view showing an electrode structure on a piezoelectric layer.
Figure 18:
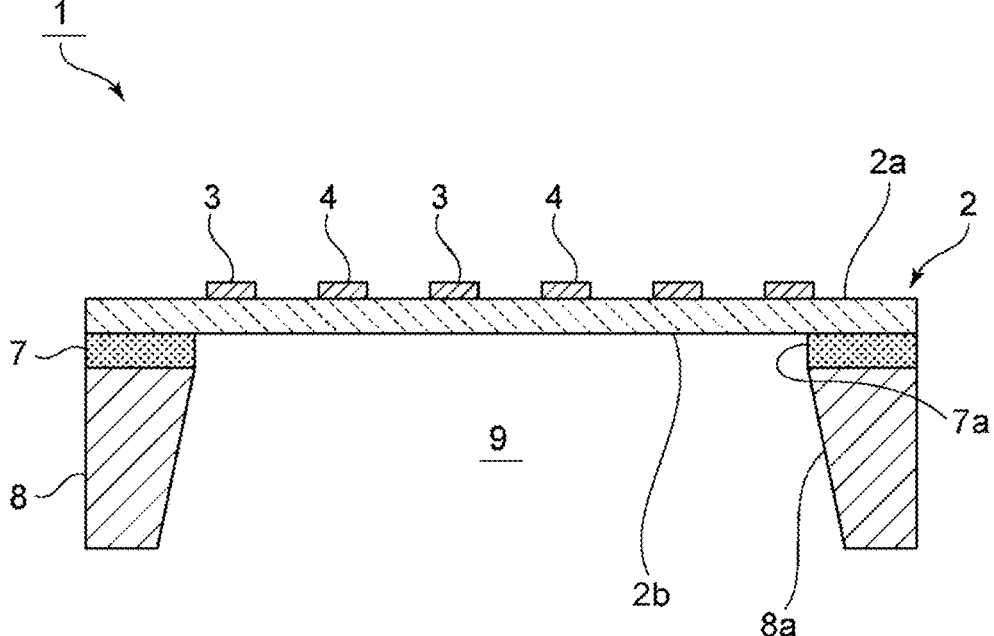
FIG. 18 is a cross-sectional view of a portion taken along line A-A in FIG. 17A.

FIG. 17A is a schematic perspective view showing an appearance of the acoustic wave device using the bulk wave in the thickness shear mode, FIG. 17B is a plan view showing an electrode structure on the piezoelectric layer, and FIG. 18 is a cross-sectional view of a portion taken along line A-A in FIG. 17A.

The acoustic wave device 1 includes a piezoelectric layer 2 including, for example, LiNbO₃. The piezoelectric layer 2 may include LiTaO₃, for example. Cut-angles of LiNbO₃ or LiTaO₃ are Z-cut, but may be a rotated Y-cut or X-cut. The thickness of the piezoelectric layer 2 is not particularly limited, but is, for example, preferably about 40 nm or larger and about 1000 nm or smaller, and more preferably about 50 nm or larger and about 1000 nm or smaller in order to effectively excite the thickness shear mode. The piezoelectric layer 2 includes first and second main surfaces 2a and 2b facing each other. Electrodes 3 and 4 are provided on the first main surface 2a. Here, the electrode 3 is an example of a "first electrode", and the electrode 4 is an example of a "second electrode". In FIGS. 17A and 17B, a plurality of the electrodes 3 are connected to a first busbar 5. A plurality of electrodes 4 are connected to a second busbar 6. The plurality of electrodes 3 and the plurality of electrodes 4 are interdigitated with each other. The electrode 3 and the electrode 4 have a rectangular or substantially rectangular shape, and have a length direction. The electrode 3 and the electrode 4 adjacent thereto face each other in a direction orthogonal or substantially orthogonal to the length direction. Both of the length direction of the electrodes 3 and 4 and the direction orthogonal or substantially orthogonal to the length direction of the electrodes 3 and 4 are directions intersecting the thickness direction of the piezoelectric layer 2. Therefore, the electrode 3 and the electrode 4 adjacent thereto face each other in the direction intersecting the thickness direction of the piezoelectric layer 2. In addition, the length direction of the electrodes 3 and 4 may be replaced with a direction orthogonal or substantially orthogonal to the length direction of the electrodes 3 and 4 shown in FIGS. 17A and 17B. That is, in FIGS. 17A and 17B, the electrodes 3 and 4 may extend in the extending direction of the first busbar 5 and the second busbar 6. In this case, the first busbar 5 and the second busbar 6 extend in the extending direction of the electrodes 3 and 4 in FIGS. 17A and 17B. A plurality of pairs of structures in which the electrode 3 connected to one potential and the electrode 4 connected to the other potential are adjacent to each other are provided in the direction orthogonal to the length direction of the electrodes 3 and 4. Here, a case where the electrodes 3 and 4 are adjacent to each other does not mean a case where the electrodes 3 and 4 are disposed to be in direct contact with each other, but means a case where the electrodes 3 and 4 are disposed with an interval therebetween. In addition, when the electrodes 3 and 4 are adjacent to each other, the electrode connected to a hot electrode or a ground electrode, including the other electrodes 3 and 4, is not disposed between the electrodes 3 and 4. The number of pairs does not need to be integer pairs, but may be 1.5 pairs, 2.5 pairs, or the like. The center-to-center distance, that is, a pitch between the electrodes 3 and 4 is, for example, preferably in a range of about 1 μm or larger and about 10 μm or smaller. In addition, the widths of the electrodes 3 and 4, that is, the dimensions of the electrodes 3 and 4 in the facing direction are, for example, preferably in a range of about 50 nm or larger and about 1,000 nm or smaller, and more preferably in a range of about 150 nm or larger and about 1,000 nm or smaller. The center-to-center distance between the electrodes 3 and 4 is a distance connecting the center of the dimension (width dimension) of the electrode 3 in the direction orthogonal or substantially orthogonal to the length direction of the electrode 3 and the center of the dimension (width dimension) of the electrode 4 in the direction orthogonal or substantially orthogonal to the length direction of the electrode 4.

In the acoustic wave device 1, since the Z-cut piezoelectric layer is used, the direction orthogonal or substantially orthogonal to the length direction of the electrodes 3 and 4 is a direction orthogonal or substantially orthogonal to a polarization direction of the piezoelectric layer 2. When piezoelectric materials with different cut-angles are used as the piezoelectric layer 2, this case is an exception. Here, description of "orthogonal" is not limited to being strictly orthogonal, but may be substantially orthogonal (angle formed by the direction orthogonal to the length direction of the electrodes 3 and 4 and the polarization direction falls within a range of about 90°±10°, for example).

A support 8 is laminated on the second main surface 2b side of the piezoelectric layer 2 with an insulating layer 7 interposed therebetween. The insulating layer 7 and the support 8 have a frame shape, and include through holes 7a and 8a as shown in FIG. 18. In this manner, a cavity portion 9 is provided. The cavity portion 9 is provided not to disturb the vibration of the excitation region C of the piezoelectric layer 2. Therefore, the support 8 is laminated on the second main surface 2b with the insulating layer 7 interposed therebetween at a position not overlapping the portion where at least the pair of electrodes 3 and 4 are provided. The insulating layer 7 does not have to be provided. Therefore, the support 8 can be directly or indirectly laminated on the second main surface 2b of the piezoelectric layer 2.

The insulating layer 7 is made of silicon oxide, for example. In addition to silicon oxide, an appropriate insulating material such as, for example, silicon oxynitride or alumina can be used. The support 8 is made of Si, for example. A plane orientation of a surface of Si on the piezoelectric layer 2 side may be (100), (110), or (111). It is preferable that Si of the support 8 is high resistance having a resistivity of about 4 kΩcm or higher, for example. The support 8 can also be made of an appropriate insulating material or semiconductor material.

Examples of the material of the support 8 include piezoelectric materials such as aluminum oxide, lithium tantalate, lithium niobate, and quartz crystal, various ceramics such as alumina, magnesia, sapphire, silicon nitride, aluminum nitride, silicon carbide, zirconia, cordierite, mullite, steatite, and forsterite, dielectrics such and as glass, and diamond semiconductors such as gallium nitride.

The plurality of electrodes 3 and 4 and the first and second busbars 5 and 6 are made of appropriate metal or alloys such as Al and AlCu alloys, for example. In the acoustic wave device 1, the electrodes 3 and 4 and the first and second busbars 5 and 6 have a structure, for example, in which Al films are laminated on a Ti film. A close contact layer other than the Ti film may be used.

During driving, an alternating current voltage is applied between the plurality of electrodes 3 and the plurality of electrodes 4. More specifically, the alternating current voltage is applied between the first busbar 5 and the second busbar 6. In this manner, it is possible to obtain the resonance characteristics using the bulk wave in the thickness shear mode excited in the piezoelectric layer 2. In the acoustic wave device 1, when the thickness of the piezoelectric layer 2 is defined as d and the center-to-center distance between any adjacent electrodes 3 and 4 in the plurality of pairs of electrodes 3 and 4 is defined as p, d/p is, for example, about 0.5 or smaller. In this manner, the bulk wave in the thickness shear mode is effectively excited, and satisfactory resonance characteristics can be obtained. More preferably, d/p is, for example, about 0.24 or smaller, and in this case, more satisfactory resonance characteristics can be obtained.

In the acoustic wave device 1, since the above-described configuration is provided, even when the number of pairs of the electrodes 3 and 4 is reduced to reduce the size, a Q value is less likely to decrease. The reason for this is that a propagation loss is small even when the number of electrode fingers in reflectors on both sides is reduced. In addition, the number of electrode fingers can be reduced by using the bulk wave in the thickness shear mode. A difference between a Lamb wave used for the acoustic wave device and the bulk wave in the thickness shear mode will be described with reference to FIGS. 19A and 19B.

Figure 19A:
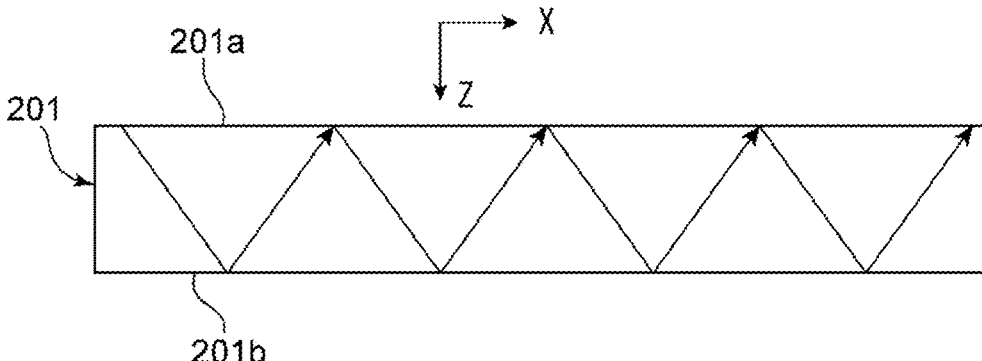
FIG. 19A is a schematic elevational cross-sectional view for describing a Lamb wave propagating through a piezoelectric film of the acoustic wave device.

FIG. 19A is a schematic elevational cross-sectional view showing the Lamb wave propagating through the piezoelectric film of the acoustic wave device as described in Japanese Unexamined Patent Application Publication No. 2012-257019. Here, the wave propagates through a piezoelectric film 201 as indicated by an arrow. Here, in the piezoelectric film 201, a first main surface 201a and a second main surface 201b face each other, and the thickness direction connecting the first main surface 201a and the second main surface 201b is a Z-direction. An X-direction is a direction in which the electrode fingers of the IDT electrodes are aligned. As shown in FIG. 19A, in the Lamb wave, a wave propagates in the X-direction as shown in the drawing. Since the wave is a plate wave, the piezoelectric film 201 vibrates as a whole. Since the wave propagates in the X-direction, the reflectors are disposed on both sides to obtain the resonance characteristics. Therefore, the propagation loss of the wave occurs, and the Q value decreases when the size is reduced, that is, when the number of pairs of the electrode fingers is reduced.

Figure 19B:
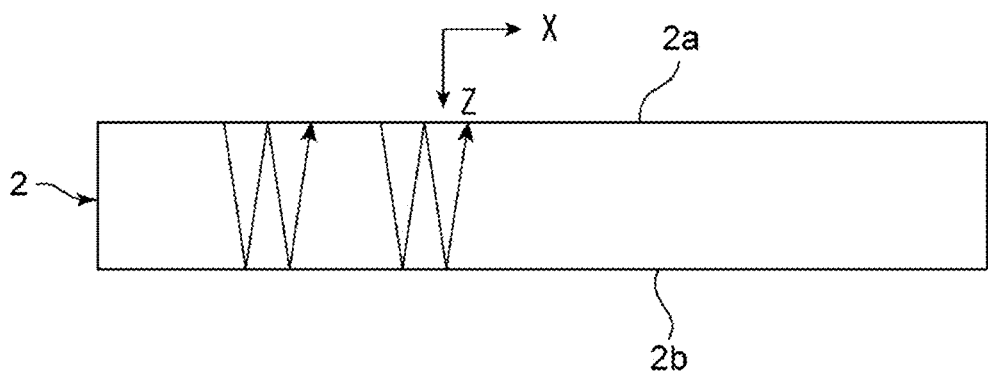
FIG. 19B is a schematic elevational cross-sectional view for describing the bulk wave in the thickness shear mode, which propagates through the piezoelectric film in the acoustic wave device.

In contrast, as shown in FIG. 19B, in the acoustic wave device 1, since vibration displacement occurs in a thickness shear direction, the waves mostly propagate and resonate in a direction connecting the first main surface 2a and the second main surface 2b of the piezoelectric layer 2, that is, the Z-direction. That is, an X-direction component of the wave is significantly smaller than a Z-direction component. In addition, since the resonance characteristics are obtained by the propagation of the wave in the Z-direction, the propagation loss is less likely to occur even when the number of the electrode fingers of the reflector is reduced. Therefore, even when the number of pairs of the electrode pairs including the electrodes 3 and 4 is reduced to reduce the size, the Q value is less likely to decrease.

Figure 20:
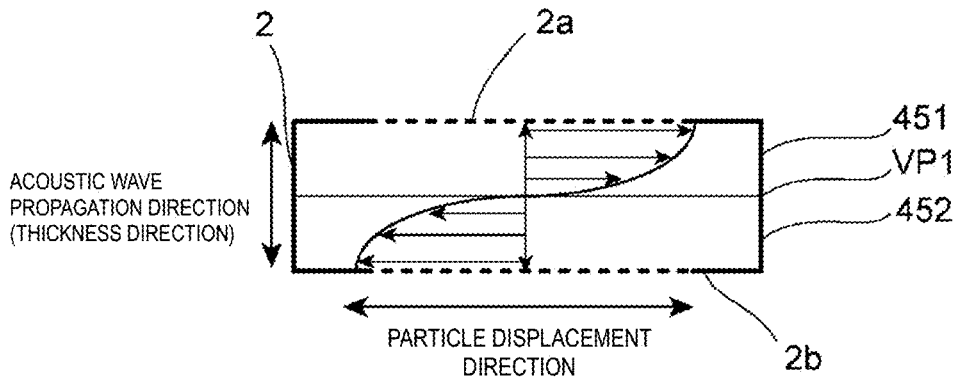
FIG. 20 is a view showing an amplitude direction of the bulk wave in the thickness shear mode.

As shown in FIG. 20, amplitude directions of the bulk wave in the thickness shear mode are opposite to each other between a first region 451 included in the excitation region C of the piezoelectric layer 2 and a second region 452 included in the excitation region C. FIG. 20 schematically shows the bulk wave when a voltage in which the electrode 4 has a higher potential than the electrode 3 is applied between the electrodes 3 and 4. The first region 451 is a region of the excitation region C between a virtual plane VP1 orthogonal or substantially orthogonal to the thickness direction of the piezoelectric layer 2 and bisecting the piezoelectric layer 2, and the first main surface 2a. The second region 452 is a region of the excitation region C between the virtual plane VP1 and the second main surface 2b.

As described above, in the acoustic wave device 1, although at least the pair of electrodes including the electrodes 3 and 4 are provided, the waves do not propagate in the X-direction. Therefore, the number of pairs of the electrode pair including the electrodes 3 and 4 does not need to be the plurality of pairs. That is, at least the pair of electrodes may be provided.

For example, the electrode 3 is the electrode connected to the hot potential, and the electrode 4 is the electrode connected to the ground potential. The electrode 3 may be connected to the ground potential, and the electrode 4 may be connected to the hot potential. In the acoustic wave device 1, as described above, at least the pair of electrodes is the electrodes connected to the hot potential or the electrodes connected to the ground potential, and a floating electrode is not provided.

Figure 21:
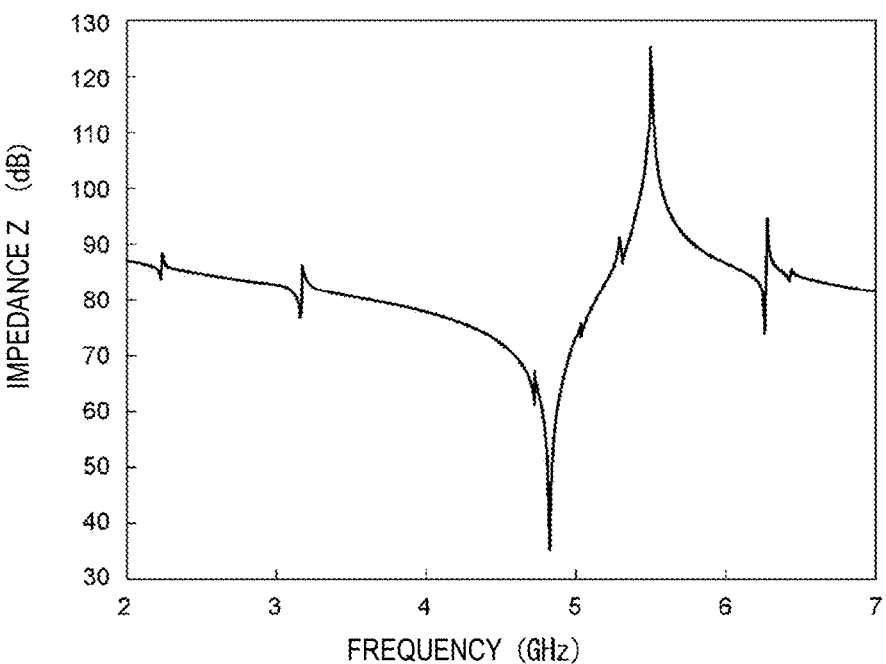
FIG. 21 is a view showing resonance characteristics of the acoustic wave device using the bulk wave in the thickness shear mode.

FIG. 21 is a view showing the resonance characteristics of the acoustic wave device shown in FIG. 18. Design parameters of the acoustic wave device 1 having the resonance characteristics are as follows.

Piezoelectric layer 2: $LiNbO_3$ with Euler angles (0°, 0°, and) 90°, thickness=about 400 nm.

When viewed in the direction orthogonal to the length direction of the electrodes 3 and 4, the length of the region where the electrodes 3 and 4 overlap each other, that is, the length of the excitation region C=about 40 μm, the number of pairs of the electrodes consisting of the electrodes 3 and 4=21 pairs, the center distance between the electrodes=about 3 μm, the width of the electrodes 3 and 4=about 500 nm, and d/p=about 0.133.

Insulating layer 7: silicon oxide film having the thickness of about 1 μm.

Support 8: Si.

The length of the excitation region C is the dimension along the length direction of the electrodes 3 and 4 of the excitation region C.

In the acoustic wave device 1, an electrode-to-electrode distance of the electrode pair including the electrodes 3 and 4 is set to be equal or substantially equal in all of the plurality of pairs. That is, the electrodes 3 and 4 are disposed at an equal or substantially equal pitch.

As is clear from FIG. 21, satisfactory resonance characteristics in which the fractional bandwidth is about 12.5% are obtained regardless of the presence of the reflector.

When the thickness of the piezoelectric layer 2 is defined as d and the center-to-center distance of the electrodes 3 and 4 is defined as p, in the acoustic wave device 1, as described above, d/p is, for example, about 0.5 or smaller, and is more preferably about 0.24 or smaller. This configuration will be described with reference to FIG. 22.

Figure 22:
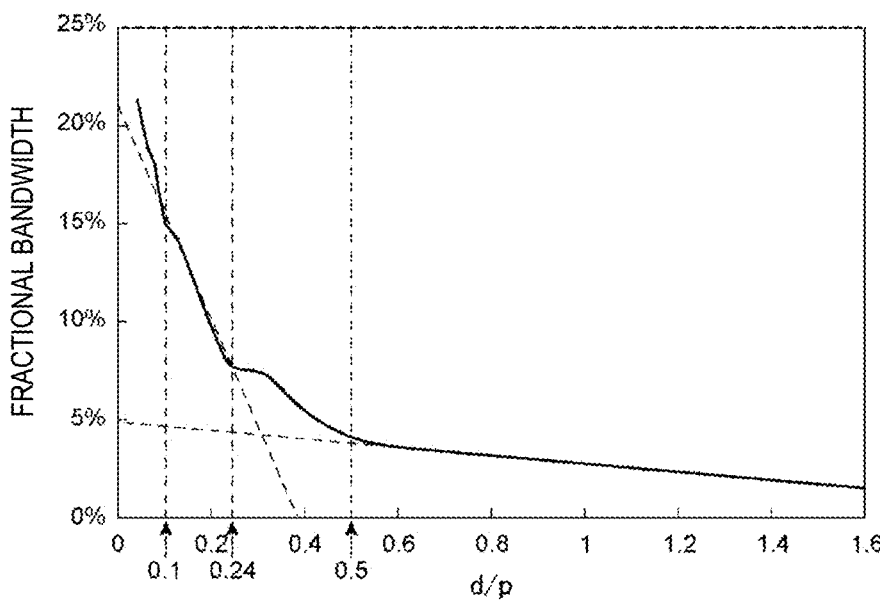
FIG. 22 is a view showing a relationship between d/p and a fractional bandwidth as a resonator when a center-to-center distance of adjacent electrodes is defined as p and a thickness of a piezoelectric layer is defined as d.

The plurality of acoustic wave devices are obtained by changing d/p as in the acoustic wave device that obtains the resonance characteristics shown in FIG. 21. FIG. 22 is a view showing a relationship between d/p and the fractional bandwidth as the resonator of the acoustic wave device.

As is clear from FIG. 22, in a case of d/p>about 0.5, the fractional bandwidth is smaller than about 5% even when d/p is adjusted. In contrast, in a case of d/p≤about 0.5, when d/p is changed within this range, the fractional bandwidth can be about 5% or larger, that is, a resonator having a high coupling coefficient can be provided. In addition, when d/p is, for example, about 0.24 or smaller, the fractional bandwidth can be increased to about 7% or larger. In addition, when d/p is adjusted within this range, a resonator having a wider fractional bandwidth can be obtained, and a resonator having a higher coupling coefficient can be realized. Therefore, it can be understood that the resonator using the bulk wave in the thickness shear mode and having the high coupling coefficient can be provided by adjusting d/p to about 0.5 or smaller.

Figure 23:
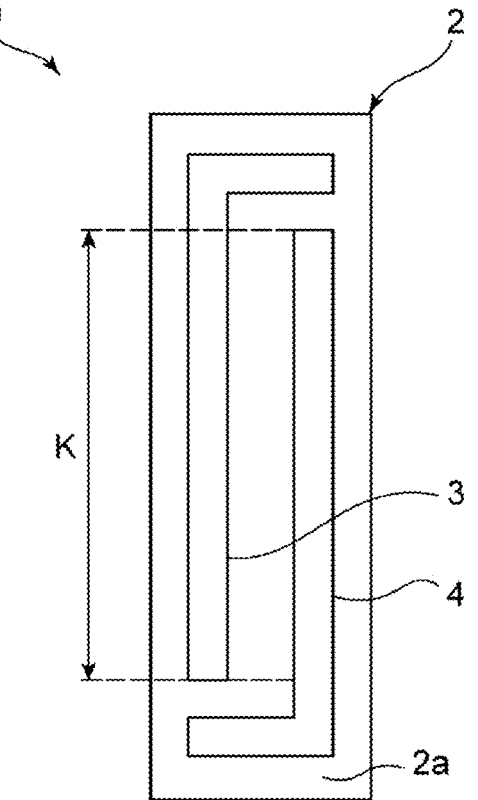
FIG. 23 is a plan view of the acoustic wave device using the bulk wave in the thickness shear mode.

FIG. 23 is a plan view of the acoustic wave device using the bulk wave in the thickness shear mode. In an acoustic wave device 80, the pair of electrodes including the electrode 3 and electrode 4 is provided on the first main surface 2a of the piezoelectric layer 2. K in FIG. 23 is an intersecting width. As described above, in the acoustic wave device according to the present invention, the number of pairs of the electrodes may be one pair. Even in this case, when d/p is about 0.5 or smaller, the bulk wave in the thickness shear mode can be effectively excited.

Figure 24:
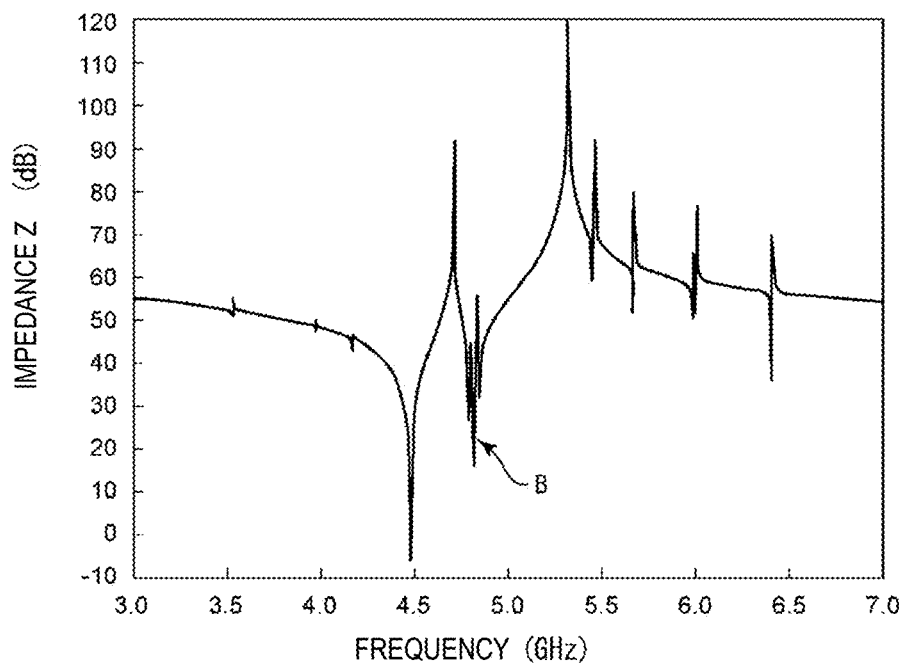
FIG. 24 is a view showing resonance characteristics of an acoustic wave device in a reference example in which a spurious mode appears.

In the acoustic wave device 1, preferably, the metallization ratio MR of any adjacent electrodes 3 and 4 in the plurality of electrodes 3 and 4 to the excitation region C, which is the region where the adjacent electrodes 3 and 4 overlap each other when viewed in the facing direction, satisfies MR≤about 1.75 (d/p)+0.075, for example. In this case, the spurious mode can be effectively reduced. This configuration will be described with reference to FIGS. 24 and 25. FIG. 24 is a reference view showing an example of the resonance characteristics of the above-described acoustic wave device 1. The spurious mode indicated by an arrow B appears between the resonant frequency and the anti-resonant frequency. In the example, d/p=about 0.08 is set, and the Euler angles (0°, 0°,) 90° of LiNbO₃ are set. In addition, the metallization ratio MR=about 0.35 is set.

The metallization ratio MR will be described with reference to FIG. 17B. In the electrode structure in FIG. 17B, in a case of focusing on the pair of electrodes 3 and 4, only the pair of electrodes 3 and 4 are provided. In this case, a portion surrounded by the one-dot chain line is the excitation region C. The excitation region C is a region that overlaps the electrode 4 in the electrode 3 when the electrode 3 and the electrode 4 are viewed in the direction orthogonal to the length direction of the electrodes 3 and 4, that is, in the facing direction, a region that overlaps the electrode 3 in the electrode 4, and a region where the electrode 3 and the electrode 4 overlap each other in the region between the electrode 3 and the electrode 4. An area of the electrodes 3 and 4 inside the excitation region C with respect to an area of the excitation region C is the metallization ratio MR. That is, the metallization ratio MR is a ratio of an area of the metallization portion with respect to an area of the excitation region C.

When the plurality of pairs of electrodes are provided, a ratio of the metallization portion included in the entire excitation region with respect to a total area of the excitation region may be MR.

Figure 25:
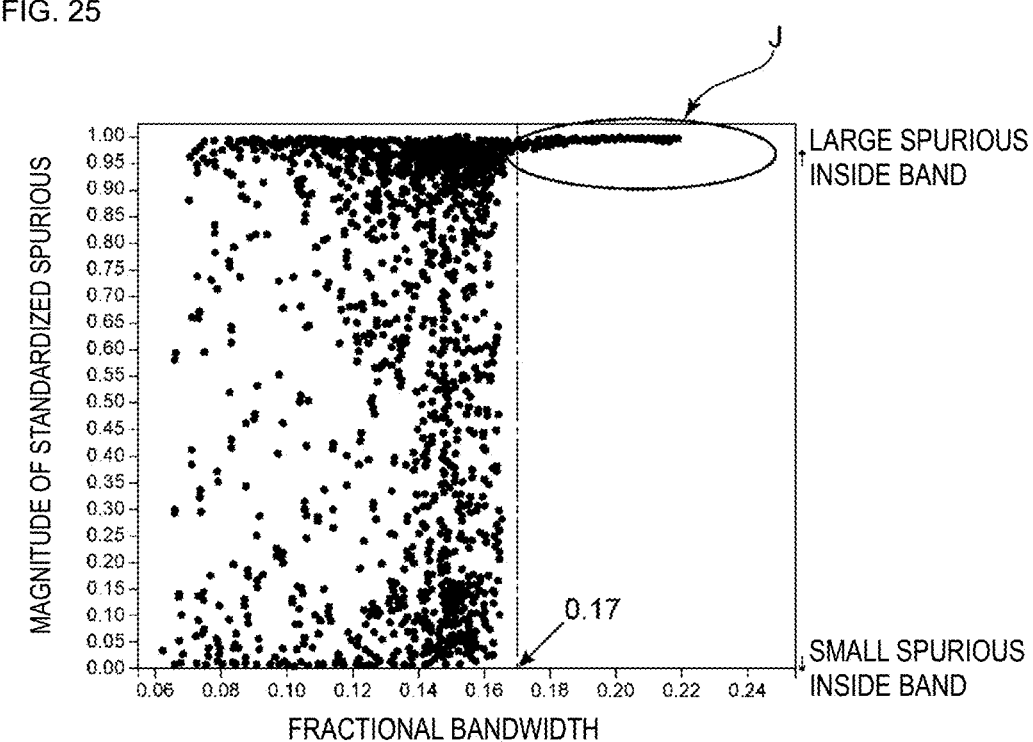
FIG. 25 is a view showing a relationship between the fractional bandwidth and a phase rotation amount of impedance of a spurious mode standardized at about 180 degrees as a magnitude of the spurious mode.

FIG. 25 is a view showing a relationship between the fractional bandwidth and a phase rotation amount of the impedance of the spurious mode standardized at about 180 degrees as a magnitude of the spurious mode when a large number of acoustic wave resonators are formed in accordance with the configuration of the acoustic wave device 1. The fractional bandwidth is adjusted by changing a film thickness of the piezoelectric layer and a dimension of the electrode in various ways. In addition, FIG. 25 shows results when the piezoelectric layer made of Z-cut LiNbO₃ is used, but shows the same or substantially the same tendency even when the piezoelectric layer having other cut-angles is used.

In a region surrounded by an ellipse J in FIG. 25, the spurious is as large as about 1.0. As is clear from FIG. 25, when the fractional bandwidth exceeds about 0.17, that is, exceeds about 17%, a large spurious mode with a spurious level of about 1 or higher appears inside a pass band even when parameters forming the fractional bandwidth are changed. That is, as in the resonance characteristics shown in FIG. 24, a large spurious mode indicated by an arrow B appears inside the band. Therefore, the fractional bandwidth is preferably about 17% or smaller, for example. In this case, the spurious can be reduced by adjusting the film thickness of the piezoelectric layer 2 and the dimensions of the electrodes 3 and 4.

Figure 26:
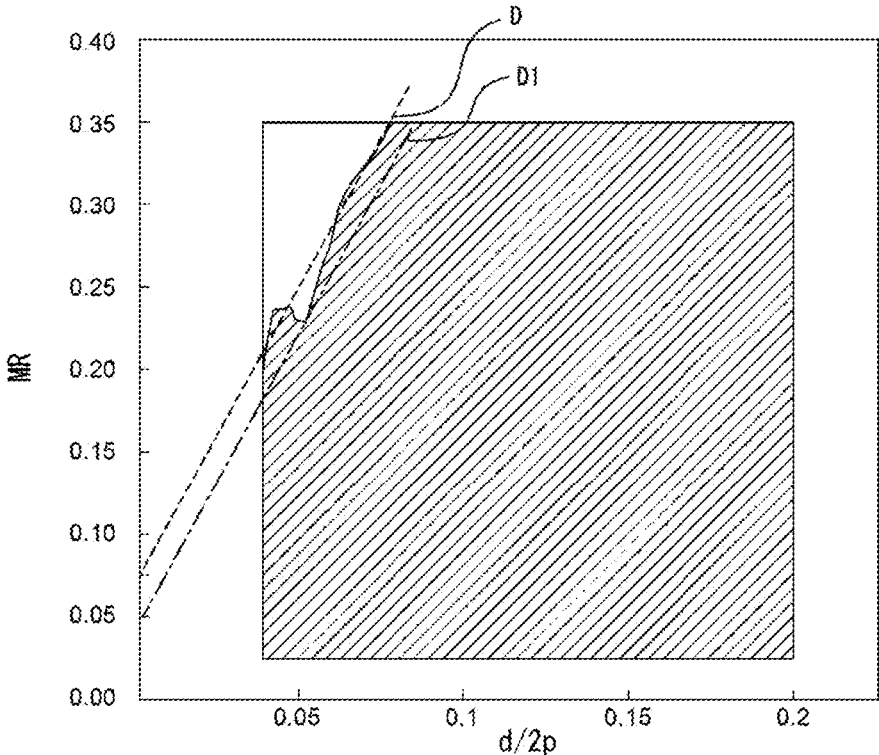
FIG. 26 is a view showing a relationship between d/2p and a metallization ratio MR.

FIG. 26 is a view showing a relationship between d/2p, the metallization ratio MR, and the fractional bandwidth. In the acoustic wave device described above, various acoustic wave devices having different d/2p and MR are configured, and the fractional bandwidth is measured. A hatched portion on a right side of a broken line D in FIG. 26 is a region where the fractional bandwidth is about 17% or smaller, for example. A boundary between the hatched region and a non-hatched region is expressed by MR=about 3.5 (d/2p)+ 0.075, for example. That is, MR=about 1.75 (d/p)+0.075. Therefore, for example, preferably, MR≤about 1.75 (d/p)+ 0.075, for example. In this case, it is easy to set the fractional bandwidth to about 17% or smaller, for example. It is more preferable, for example, to set a region on a right side of MR=about 3.5 (d/2p)+0.05 indicated by a one-dot chain line D1 in FIG. 26. That is, in a case of MR≤about 1.75 (d/p)+0.05, the fractional bandwidth can be reliably set to about 17% or smaller, for example.

Figure 27:
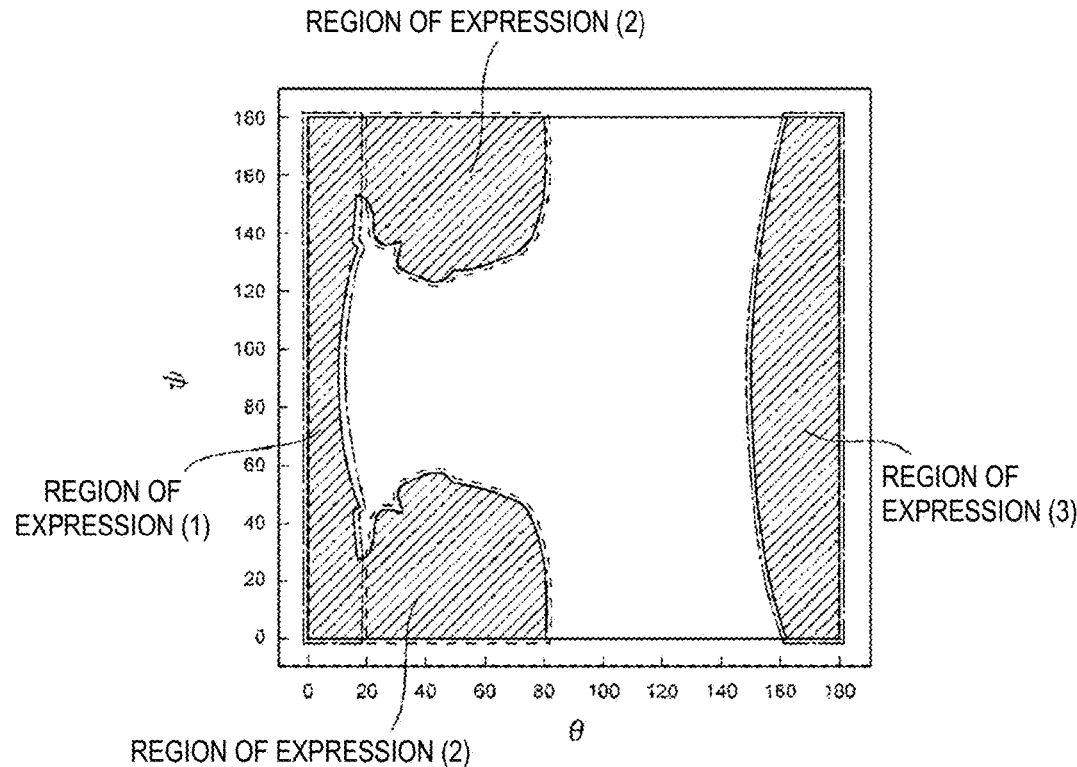
FIG. 27 is a view showing a map of the fractional bandwidth with respect to Euler angles (0°, θ, and ψ) of LiNbO$_3$ when d/p is infinitely close to 0.

FIG. 27 is a view showing a map of the fractional bandwidth with respect to Euler angles (0°, θ, and ψ) of LiNbO₃ when d/p is infinitely close to 0. A hatched portion in FIG. 27 is a region where the fractional bandwidth of at least about 5% or larger can be obtained, for example, and when a range of the region is approximated, the range is expressed by Expression (1), Expression (2), and Expression (3).

$$(0°±10°, 0° \text{ to } 20°, \text{ any } ψ) \qquad \text{Expression (1)}$$

$$(0°±10°, 20° \text{ to } 80°, 0° \text{ to } 60°(1−(θ−50)^2/900)^{1/2}) \text{ or}$$
$$(0°±10°, 20° \text{ to } 80°, [180°−60°(1−(θ−50)^2/900)^{1/2}] \text{ to) } 180° \qquad \text{Expression (2)}$$

$$(0°±10°, [180°−30°(1−(ψ−90)^2/8100)^{1/2}] \text{ to } 180°, \text{ any } ψ) \qquad \text{Expression (3)}$$

Therefore, in a case of the Euler angle range of Expression (1), Expression (2), or Expression (3), it is preferable since the fractional bandwidth can be sufficiently widened. The same applies to a case where the piezoelectric layer 2 is the lithium tantalate layer.

In the first acoustic wave resonator and the second acoustic wave resonator in the first to third example embodiments and each modified example in which the bulk wave in the thickness shear mode is used, as described above, d/p is, for example, preferably about 0.5 or smaller, and more preferably about 0.24 or smaller. In this manner, more satisfactory resonance characteristics can be obtained.

Furthermore, in the excitation region of the first acoustic wave resonator and the second acoustic wave resonator in the first to third example embodiments and each modified example in which the bulk wave of the thickness shear mode is used, as described above, it is preferable, for example, to satisfy MR≤about 1.75 (d/p)+0.075. In this case, the spurious mode can be more reliably suppressed.

The functional electrode in the first to third example embodiments and each modified example in which the bulk wave in the thickness shear mode is used may be the functional electrode including a pair of electrodes shown in FIG. 23.

It is preferable that the first piezoelectric layer and the second piezoelectric layer in the first to third example embodiments and each modified example in which the bulk wave in the thickness shear mode is used are, for example, lithium niobate layers or lithium tantalate layers. It is preferable that the Euler angles (φ, θ, and ψ) of lithium niobate or lithium tantalate forming the first piezoelectric layer and the second piezoelectric layer are within a range of Expression (1), Expression (2), or Expression (3) above. In this case, the fractional bandwidth can be sufficiently widened.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a first acoustic wave resonator and a second acoustic wave resonator, each including a piezoelectric layer and a functional electrode on the piezoelectric layer; and
an acoustic coupling layer laminated between the piezoelectric layer of the first acoustic wave resonator and the piezoelectric layer of the second acoustic wave resonator; wherein

23

24 each of the functional electrodes of the first acoustic wave resonator and the second acoustic wave resonator includes at least one pair of electrode fingers;

when in each of the first acoustic wave resonator and the second acoustic wave resonator, a thickness of the piezoelectric layer is defined as d and a center-to-center distance between electrode fingers of the at least one pair of electrode fingers adjacent to each other is defined as p, d/p is about 0.5 or smaller; and the first acoustic wave resonator and the second acoustic wave resonator face each other across the acoustic coupling layer.

2. The acoustic wave device according to claim 1, wherein an acoustic impedance of the acoustic coupling layer is lower than an acoustic impedance of at least one of the piezoelectric layers of the first acoustic wave resonator and the second acoustic wave resonator.

3. The acoustic wave device according to claim 2, wherein the at least one pair of electrode fingers of the functional electrode of each of the first acoustic wave resonator and the second acoustic wave resonator includes a signal potential electrode finger connected to a signal potential and a reference potential electrode finger connected to a reference potential; and the reference potential electrode finger of the first acoustic wave resonator and the reference potential electrode finger of the second acoustic wave resonator face each other across the acoustic coupling layer.

4. The acoustic wave device according to claim 1, wherein the at least one pair of electrode fingers of the functional electrode of each of the first acoustic wave resonator and the second acoustic wave resonator includes a signal potential electrode finger connected to a signal potential and a reference potential electrode finger connected to a reference potential; and the signal potential electrode finger of the first acoustic wave resonator and the signal potential electrode finger of the second acoustic wave resonator face each other across the acoustic coupling layer.

5. The acoustic wave device according to claim 1, wherein a polarization axis direction of the piezoelectric layer of the first acoustic wave resonator and a polarization axis direction of the piezoelectric layer of the second acoustic wave resonator are a same or substantially a same direction.

6. The acoustic wave device according to claim 1, wherein a polarization axis direction of the piezoelectric layer of the first acoustic wave resonator and a polarization axis direction of the piezoelectric layer of the second acoustic wave resonator are directions opposite to each other.

7. The acoustic wave device according to claim 1, wherein in each of the first acoustic wave resonator and the second acoustic wave resonator, the functional electrode includes a pair of busbars facing each other; and each of the pair of busbars is connected to at least one of the electrode fingers;

one of the pair of busbars is a reference potential busbar connected to a reference potential; and the reference potential busbar of the first acoustic wave resonator and the reference potential busbar of the second acoustic wave resonator face each other across the acoustic coupling layer.

8. The acoustic wave device according to claim 1, wherein d/p is about 0.24 or smaller in each of the first acoustic wave resonator and the second acoustic wave resonator.

9. The acoustic wave device according to claim 1, wherein in each of the first acoustic wave resonator and the second acoustic wave resonator, when viewed in a direction orthogonal or substantially orthogonal to an extending direction of the at least one pair of electrode fingers, which is a region where the adjacent electrode fingers overlap each other, is an excitation region; and in each of the first acoustic wave resonator and the second acoustic wave resonator, when a metallization ratio of the electrode finger to the excitation region is defined as MR, MR≤about 1.75 (d/p)+0.075 is satisfied.

10. The acoustic wave device according to claim 1, wherein in each of the first acoustic wave resonator and the second acoustic wave resonator, the piezoelectric layer includes lithium tantalate or lithium niobate.

11. The acoustic wave device according to claim 10, wherein in each of the first acoustic wave resonator and the second acoustic wave resonator, Euler angles ($\varphi$, $\theta$, and $\psi$) of lithium niobate or lithium tantalate of the piezoelectric layer are in a range of Expression (1), Expression (2), or Expression (3):

$$(0°\pm10°,0° \text{ to } 20°, \text{any } \psi) \qquad \text{Expression (1)};$$

$$(0°\pm10°,20° \text{ to } 80°,0° \text{ to } 60°(1-(\theta-50)^2/900)^{1/2}) \text{ or}$$
$$(0°\pm10°,20° \text{ to } 80°,[180°-60°(1-(\theta-50)^2/900)^{1/2}] \text{ to}) 180° \qquad \text{Expression (2); and}$$

$$(0°\pm10°,[180°-30°(1-(\psi-90)^2/8100)^{1/2}] \text{ to } 180°, \text{any } \psi) \qquad \text{Expression (3)}.$$

12. The acoustic wave device according to claim 1, further comprising:

a support including a support substrate; wherein a multilayer body of the first acoustic wave resonator, the second acoustic wave resonator, and the acoustic coupling layer is provided on the support.

13. The acoustic wave device according to claim 12, wherein in a plan view along a lamination direction of the multilayer body, a cavity portion is provided at a position overlapping at least a portion of the functional electrode of the first acoustic wave resonator and at least a portion of the functional electrode of the second acoustic wave resonator in the support; and the support and the multilayer body are positioned such that a portion of the support and a portion of the multilayer body face each other across the cavity portion.

14. A filter device comprising:

the acoustic wave device according to claim 1; and at least one resonator other than the first acoustic wave resonator and the second acoustic wave resonator.

15. The filter device according to claim 14, wherein an acoustic impedance of the acoustic coupling layer is lower than an acoustic impedance of at least one of the piezoelectric layers of the first acoustic wave resonator and the second acoustic wave resonator.

16. The filter device according to claim 15, wherein the at least one pair of electrode fingers of the functional electrode of each of the first acoustic wave resonator and the second acoustic wave resonator includes a signal potential electrode finger connected to a signal potential and a reference potential electrode finger connected to a reference potential; and the reference potential electrode finger of the first acoustic wave resonator and the reference potential electrode finger of the second acoustic wave resonator face each other across the acoustic coupling layer.

17. The filter device according to claim 14, wherein the at least one pair of electrode fingers of the functional electrode of each of the first acoustic wave resonator and the second acoustic wave resonator includes a signal potential electrode finger connected to a signal potential and a reference potential electrode finger connected to a reference potential; and the signal potential electrode finger of the first acoustic wave resonator and the signal potential electrode finger of the second acoustic wave resonator face each other across the acoustic coupling layer.

18. The filter device according to claim 14, wherein a polarization axis direction of the piezoelectric layer of the first acoustic wave resonator and a polarization axis direction of the piezoelectric layer of the second acoustic wave resonator are a same or substantially a same direction.

19. The filter device according to claim 14, wherein a polarization axis direction of the piezoelectric layer of the first acoustic wave resonator and a polarization axis direction of the piezoelectric layer of the second acoustic wave resonator are directions opposite to each other.

20. The filter device according to claim 14, wherein in each of the first acoustic wave resonator and the second acoustic wave resonator, the functional electrode includes a pair of busbars facing each other; and each of the pair of busbars is connected to at least one of the electrode fingers;

one of the pair of busbars is a reference potential busbar connected to a reference potential; and the reference potential busbar of the first acoustic wave resonator and the reference potential busbar of the second acoustic wave resonator face each other across the acoustic coupling layer.

\* \* \* \* \*